(12) United States Patent
Xie et al.

(10) Patent No.: US 8,057,704 B2
(45) Date of Patent: Nov. 15, 2011

(54) PHOSPHOR, METHOD FOR PRODUCING SAME, AND LIGHT-EMITTING DEVICE

(75) Inventors: Rong-Jun Xie, Ibaraki (JP); Naoto Hirosaki, Ibaraki (JP)

(73) Assignee: National Institute for Materials Science, Tsukuba-shi (JP)

( * ) Notice: Subject to any disclaimer, the term of this patent is extended or adjusted under 35 U.S.C. 154(b) by 617 days.

(21) Appl. No.: 12/280,557

(22) PCT Filed: Feb. 22, 2007

(86) PCT No.: PCT/JP2007/053324
§ 371 (c)(1),
(2), (4) Date: Sep. 17, 2008

(87) PCT Pub. No.: WO2007/099862
PCT Pub. Date: Sep. 7, 2007

(65) Prior Publication Data
US 2009/0121608 A1    May 14, 2009

(30) Foreign Application Priority Data

Feb. 24, 2006 (JP) ................................. 2006-047729

(51) Int. Cl.
*H01J 29/20* (2006.01)
*H01J 31/12* (2006.01)
*H01J 31/15* (2006.01)
*H01J 31/20* (2006.01)
*H01L 33/00* (2010.01)
*H01S 5/022* (2006.01)
*C09K 11/64* (2006.01)

(52) U.S. Cl. ............. 252/301.4 R; 252/301.4 F; 257/98; 313/503; 313/487; 313/467

(58) Field of Classification Search ........... 252/301.4 R, 252/301.4 F; 257/98; 313/503, 487, 467
See application file for complete search history.

(56) References Cited

U.S. PATENT DOCUMENTS

| 2003/0006400 | A1 | 1/2003 | Noguchi |
| 2006/0033081 | A1 | 2/2006 | Hintzen |
| 2006/0192178 | A1 | 8/2006 | Hirosaki |
| 2007/0007494 | A1 | 1/2007 | Hirosaki |
| 2007/0018567 | A1 | 1/2007 | Hirosaki |
| 2007/0108896 | A1 | 5/2007 | Hirosaki |
| 2007/0194685 | A1 | 8/2007 | Hirosaki |
| 2007/0257231 | A1 | 11/2007 | Hirosaki |

FOREIGN PATENT DOCUMENTS

| EP | 0 155 047 A1 | 9/1985 |
| EP | 0155047 A1 | 9/1985 |
| JP | S60-206889 A | 10/1985 |
| JP | 2001-172625 A | 6/2001 |
| JP | 2002-363554 A | 12/2002 |
| JP | 2003-055657 A | 2/2003 |
| JP | 2004-234690 A | 8/2004 |
| JP | 2004-285363 A | 10/2004 |
| JP | 2005-048105 A | 2/2005 |
| JP | 2005-112922 A | 4/2005 |
| JP | 3668770 B | 7/2005 |
| JP | 2005-255895 A | 9/2005 |
| JP | 2005-529229 A | 9/2005 |
| WO | 02/057182 A2 | 7/2002 |
| WO | WO 2004/029177 A1 | 8/2004 |
| WO | WO 2005/019376 A1 | 3/2005 |
| WO | WO 2005/052087 A1 | 6/2005 |
| WO | WO 2006/016711 A1 | 2/2006 |

OTHER PUBLICATIONS

Krevel Van, "Luminescence properties of rare earth doped Alpha-SiAION materials" on New Rare-Earth Doped M-Si-Al-O-N Materials, XX, XX, Jan. 1, 2000, pp. 145-157, XP008060386, Chapter 11.
EP 07737317 Supplementary Partial European Search Report dated Feb. 16, 2010.
Caldwell et al., Visible Luminescent Activation of Amorphous AlN:Eu Thin-Film Phosphors with Oxygen, MRS Internet Journal Nitride Semiconductor Research, 2001, pp. 1-5, 6-13, The Materials Research Society, United States.
Richardson et al., Thin-film electroluminescent devices grown on plastic substrates using an amorphous AlN:Tb3+phosphor, Applied Physics Letters, 2002, pp. 2207-2209, 80-12, American Institute of Physics, United States.
Vetter et al., Intense ultraviolet cathodoluminescence at 318 nm from Gd3+ -doped AlN, Applied Physics Letters, 2003, pp. 2145-2147, 83-11, American Institute of Physics, United States.
Willems et al., Newtron Diffraction of γ -Aluminum Oxynitride, Journal of Materials Science Letters, 1993, pp. 1470-1472, vol. 12, Chapman & Hall, The Netherlands.
Inorganic Crystal Structure Database (ICSD) No. 70032, Fachinformationszentrum Karlsruhe, Germany.—Related to NPL Reference No. 4, Apr. 22, 1996.
EP 07737317 European Patent Office Office Action dated May 17, 2011.
Vandamme N.S. et al., "Liquid-Phase Sintering of ALuminum Nitride by Europium Oxide Additives," Journal of the American Ceramic Society, Blackwell Publishing, Malden, MA, US, vol. 72, No. 8, Aug. 1, 1989, pp. 1409-1414, XP000115194.

*Primary Examiner* — Carol M Koslow
(74) *Attorney, Agent, or Firm* — Trojan Law Offices

(57) ABSTRACT

Disclosed are violet, blue, and green phosphors having excellent durability and high luminance. Specifically disclosed is a phosphor which contains a metal element M (M is at least one element selected from among Mn, Ce, Pr, Nd, Sm, Eu, Gd, Tb, Dy, Tm and Yb) for constituting a metal ion, which is solid-solubilized in an AlON crystal, an AlON solid solution crystal or an inorganic crystal having the same crystal structure as AlON. The phosphor is capable of emitting fluorescence having a peak in the wavelength range from 300 nm to 700 nm. Also disclosed is a method for producing such a phosphor. Further disclosed are an illuminating device and an image display each containing such a phosphor.

21 Claims, 14 Drawing Sheets

PHOSPHOR, METHOD FOR PRODUCING SAME, AND LIGHT-EMITTING DEVICE

PRIORITY CLAIM

The present application is a U.S. National Stage Application under 35 U.S.C. 371 of PCT/JP2007/053324, filed on Feb. 22, 2007, which claims priority to Japanese Patent Application 2006-047729, filed on Feb. 24, 2006.

BACKGROUND OF THE INVENTION

1. Field of the Invention

The present invention relates to a phosphor comprising, as a host crystal, an AlON (oxynitride aluminum) crystal, an AlON solid solution crystal, or an inorganic crystal having the same crystal structure as AlON; a manufacturing method thereof; and an application thereof. More specifically, the application relates to a lighting device and an emission apparatus of an image display device utilizing features of the phosphor, that is, property of emitting light having a peak in a wavelength range of 300 nm or longer and 700 nm and shorter.

2. Description of Related Art

The phosphor is utilized in a fluorescent display tube (VFD: vacuum-fluorescent display), a field emission display (FED: Field Emission Display) or SED (Surface-Conduction Electron-Emitter Display), a plasma display panel (PDP: Plasma Display Panel), a cathode-ray tube (CRT: Cathode-Ray Tube), a white light-emitting diode (LED: Light-Emitting Diode), and so on. In any of these applications, it is necessary to provide the phosphor with energy to excite the phosphor in order to make the phosphor emit the fluorescence and the phosphor is excited by an excitation source with high energy such as vacuum ultraviolet rays, ultraviolet rays, an electron beam, or blue light so as to emit visible light rays. However, as a result of the phosphor being exposed to such excitation source, the luminance of the phosphor tends to decrease. Therefore, a phosphor having little degradation in the brightness is desired. Therefore, it has been proposed not to uses an conventional phosphor such as silicate phosphor, phosphate phosphor, aluminate phosphor, or sulfide phosphor but instead to use a phosphor having an inorganic crystal as a host containing nitrogen in the crystal structure such as a sialon phosphor, an oxynitride phosphor, or a nitride phosphor as a phosphor having little degradation in brightness.

As an example of these sialon phosphors is one manufactured by the following manufacturing process as generally described below. First, silicon nitride ($Si_3N_4$), aluminum nitride (AlN), and Europium oxide ($Eu_2O_3$) are mixed in predetermined molar ratios and the resultant mixture is fired by a hot press method in one atmospheric pressure (0.1 MPa) of nitrogen atmosphere at 1700° C. for one hour (for example, refer to Patent Document 1). It was reported that α-sialon activated with Eu ion ($Eu^{2+}$) manufactured by the above process became a phosphor that emitted yellow light of wavelength range of 550 nm to 600 nm if excited by blue light having a wavelength range of 450 to 500 nm. A phosphor in which a rare-earth element is added to β-type sialon is also known (refer to Patent Document 2) and it is shown that phosphors activated by Tb, Yb, and Ag are ones which emit green light of 525 nm to 545 nm. It is also known that β-type sialon activated by $Eu^{2+}$ becomes a phosphor of green color (refer to Patent Document 3).

As an example of the oxynitride phosphor, a blue phosphor activated by Ce having a host crystal of JEM phase ($LaAl(Si_{6-z}Al_z)N_{10-z}O_z$) (refer to Patent Document 4) and a blue phosphor activated by Ce having a host crystal of $La_3Si_8N_{11}O_4$ (refer to Patent Document 5) are known.

As an example of the nitride phosphor, a red phosphor activated by $Eu^{2+}$ having a host crystal of $CaAlSiN_3$ (refer to Patent Document 6) is known. Moreover, Nonpatent Document 1 reports that as a phosphor having AlN as a host, an orange or red phosphor having an emission peak from Eu ion ($Eu^{3+}$) in the range of 580 nm to 640 nm was obtained as an amorphous ceramic thin film of phosphor activated by trivalent Eu ion ($Eu^{3+}$) (i.e., AlN: $Eu^{3+}$) by synthesis using a magnetron sputtering method at the room temperature. In Nonpatent Document 2, it is reported that a phosphor of amorphous AlN thin film activated by $Tb^{3+}$ emits green light having a peak at 543 nm upon excitation by an electron beam. In Nonpatent Document 3, a phosphor of AlN thin film activated by $Gd^{3+}$ is reported. However, these kinds of phosphors based on AlN are amorphous thin films which are not suitable for any application in a light or an image display device.

As a blue phosphor for application to an image display device (VFD, FED, SED, or CRT) using an electron beam as the excitation source, a phosphor having $Y_2SiO_5$ as a host crystal and including solid-solute Ce (Patent Document 7) and a phosphor of ZnS including a solid-solute emission ion such as Ag (Patent Document 8) are reported.

The present inventors proposed a phosphor having an AlN structure crystal as a host crystal and including divalent Eu ion ($Eu^{2+}$) (i.e., AlN: $Eu^{2+}$) in Patent Document 9 (not yet published). The phosphor can be obtained by firing a composite of AlN to which $Si_3N_4$ and $Eu_2O_3$ are added at a higher temperature than 1800° C. and shows a blue fluorescence derived from $Eu^{2+}$ as divalent Eu ions ($Eu^{2+}$) are stabilized by incorporating Si, Eu, and oxygen into the AlN crystal structure.

[Patent Document 1] Specification of Japanese Patent No. 3,668,770
[Patent Document 2] Japanese Patent Application Publication No. S60-206889
[Patent Document 3] Japanese Patent Application Publication No. 2005-255895
[Patent Document 4] WO 2005/019376
[Patent Document 5] Japanese Patent Application Publication No. 2005-112922
[Patent Document 6] WO 2005/052087
[Patent Document 7] Japanese Patent Application Publication No. 2003-55657
[Patent Document 8] Japanese Patent Application Publication No. 2004-285363
[Patent Document 8] Japanese Patent Application No. 2004-234690
[Nonpatent Document 1] Meghan L. Caldwell, et al., "Visible Luminescent Activation of Amorphous AlN: Eu Thin-Film Phosphors with Oxygen", MRS Internet Journal Nitride Semiconductor Research, Vol. 6, Num. 13, P 1-8, 2001.
[Nonpatent Document 2] H. H. Richardson, et al., "Thin-film electroluminescent devices grown on plastic substrates using an amorphous AlN: $Tb^{3+}$ phosphor," Applied Physics Letters, Vol. 80, No. 12, p. 2207-2209, 2002.
[Nonpatent Document 3] U. Vetter, et al., "Intense ultraviolet cathodoluminescence at 318 nm from $Gd^{3+}$-doped AlN," Applied Physics Letters, Vol. 83, No. 11, P 2145-2147, 2003.
[Nonpatent Document 4] H. X. Willems et. al., "Neutron diffraction of γ-aluminium oxynitride", Journal of materials science letters, Vol. 12, p. 1470-1472, 1993.
[Nonpatent Document 5] ICSD No. 70032, ICSD (Inorganic crystal structure database) database (Fachinformationszentrum Karlsruhe, issued by Germany).

SUMMARY OF THE INVENTION

Disclosure of the Invention

Problem to be Solved by the Invention

Violet, blue, and green phosphors are, in addition to red and yellow phosphors, in demand as phosphors having excellent durability and high brightness for application to plasma displays and white light LEDs utilizing an ultraviolet LED as an excitation source. Further, the prior art phosphor including oxynitride as a host is an insulating material so that the emission intensity thereof is low even upon irradiation with the electron beam. Therefore, a phosphor that emits luminescence with high intensity upon irradiation with the electron beam is in demand for application to image display devices such as FEDs using electron beam excitation.

An oxide phosphor disclosed in Patent Document 7 which is used with electron beam excitation might deteriorate during use so that the emission intensity might be lowered, thereby changing the color balance in the image display device. A sulfide phosphor disclosed in Patent Document 8 might be decomposed during use so that sulfur might be scattered to contaminate the device.

An object of the present invention is to try to satisfy such demand and to provide phosphors, particularly violet, blue, and green phosphors, in a powder state that have better emission properties than the prior art sialon phosphor activated by a rare earth element and higher durability than the prior art oxide phosphor, and emits light with high intensity upon irradiation with an electron beam.

Means to Solve the Problem

Under the foregoing circumstances, the present inventors, focusing on the AlON crystal, conducted an intensive investigation regarding nitride or oxynitride incorporating at least metal element M (where M is one or more elements selected from among Mn, Ce, Pr, Nd, Sm, Eu, Gd, Tb, Dy, Tm, and Yb) constituting a metal ion in solid solution in an AlON crystal, an AlON solid solution crystal, or an inorganic crystal having the same crystal structure as AlON, and found that one having a specific composition range, a specific solid solution state, and a specific crystalline phase can become a blue phosphor having an emission peak in a wavelength of 300 nm to 700 nm. In particular, it was found that one having a specific composition range and incorporating Ce as in solid solution emits light of violet to blue color with high brightness upon excitation with ultraviolet rays or an electron beam so as to be suitable for application to a lighting device or an image display device which is excited by the electron beam.

According to Nonpatent Documents 1, 2, and 3, it is reported that thin films composed of AlN amorphous thin films activated by $Eu^{3+}$, $Tb^{3+}$, and $Gd^{3+}$ emit light upon the electron beam excitation. However, it has never been considered to try to utilize, as the phosphor, the AlON crystal which is a crystal containing the same amount level of oxygen as nitrogen. That is, the present inventors for the first time made the important discovery that the AlON or AlON solid solution crystal incorporating a specific metal element and silicon in solid solution can be utilized as a phosphor that emits light with high brightness upon excitation by ultraviolet rays and visible light, or an electron beam or X-rays.

As a result of further intensive investigations on the basis of this discovery, a phosphor that shows a luminous phenomenon with high intensity in a specific wavelength range and a manufacturing method of the phosphor, and a lighting device and an image display device having superior properties have been successfully provided. These are more specifically described in the following (1) to (21).

(1) A phosphor comprising: an inorganic crystal having a composition formula: $M_a A_b Al_c O_d N_e$ (where M is at least one selected from among Mn, Ce, Pr, Nd, Sm, Eu, Gd, Tb, Dy, Tm, and Yb, and A is one or two or more kinds of metal elements other than M and Al, and a+b+c+d+e=1), wherein parameters a, b, c, d, and e satisfy the following:

$$0.00001 \leq a \leq 0.1 \quad (i),$$

$$0 \leq b \leq 0.40 \quad (ii),$$

$$0.10 \leq c \leq 0.48 \quad (iii),$$

$$0.25 \leq d \leq 0.60 \quad (iv), \text{ and}$$

$$0.02 \leq e \leq 0.35 \quad (v); \text{ and}$$

wherein the phosphor emits fluorescence having a peak in a wavelength range of 300 nm to 700 nm upon irradiation with an excitation source.

(2) The phosphor according to the above (1), wherein the element A is at least one selected from among Si, Mg, and Ca.

(3) The phosphor according to the above (1), wherein the element A is not contained, that is, a value of b is 0, and wherein parameters c, d, and e satisfy the following:

$$0.25 \leq c \leq 0.48 \quad (vi),$$

$$0.45 \leq d \leq 0.60 \quad (vii), \text{ and}$$

$$0.02 \leq e \leq 0.20 \quad (viii).$$

(4) The phosphor according to any one of the above (1) to (3), wherein the inorganic crystal is an AlON crystal or an AlON solid solution crystal, or has a same crystal structure as the AlON, and wherein at least metal element M constituting a metal ion (where M is at least one selected from among Mn, Ce, Pr, Nd, Sm, Eu, Gd, Tb, Dy, Tm, and Yb) is incorporated the inorganic crystal in solid solution.

(5) The phosphor according to the above (4), wherein the inorganic crystal is the AlON crystal or the AlON solid solution crystal, and wherein the metal element M constituting a metal ion is incorporated in the inorganic crystal in solid solution.

(6) The phosphor according to any one of the above (1) to (5) wherein the excitation source is any one of ultraviolet or visible light having a wavelength that is at least 100 nm and does not exceed 500 nm, an electron beam, and X-rays.

(7) The phosphor according to any one of the above (1) to (6), wherein at least Eu as the metal element M constituting a metal ion is incorporated in the inorganic crystal in solid solution, and wherein the phosphor emits fluorescence having a peak in a wavelength range of 350 nm to 450 nm upon irradiation with the excitation source.

(8) The phosphor according to the above (7), wherein an excitation spectrum has a peak in a wavelength range of 230 nm to 350 nm.

(9) The phosphor according to any one of the above (1) to (6), wherein at least Ce as the metal element M constituting a metal ion is contained, and wherein the phosphor emits fluorescence having a peak in a wavelength range of 350 nm to 450 nm upon irradiation with the excitation source.

(10) The phosphor according to the above (9), wherein an excitation spectrum has a peak in a wavelength range of 230 nm to 350 nm.

(11) The phosphor according to any one of the above (1) to (6), wherein at least Mn as the metal element M constituting a metal ion is contained and wherein the phosphor emits fluorescence having a peak in a wavelength range of 470 nm to 570 nm upon irradiation with the excitation source.

(12) The phosphor according to the above (11), wherein an excitation spectrum has a peak in a wavelength range of 230 nm to 450 nm.

(13) The phosphor according to any one of the above (1) to (6), wherein at least Ce and Mn as the metal element M constituting metal ions are contained and wherein the phosphor emits fluorescence having a peak in a wavelength range of 470 nm to 570 nm upon irradiation with the excitation source.

(14) The phosphor according to the above (13), wherein an excitation spectrum has a peak in a wavelength range of 150 nm to 350 nm.

(15) A manufacturing method of the phosphor recited in any one of the above (1) to (14), wherein after a raw material mixture including at least aluminum oxide; aluminum nitride; and M metal, M oxide, M carbonate, M nitride, M fluoride, M chloride, M oxynitride, or a combination thereof (where A is one or two or more elements selected from among Mg, Ca, Sr, Ba, Zn, and Cd) is filled into a container at a packing fraction that does not exceed 40% of a bulk density, the raw material mixture is fired in a nitrogen atmosphere that is at least 0.1 MPa and does not exceed 100 MPa in a temperature range that is at least 1500° C. and does not exceed 2200° C.

(16) A lighting device comprising: an emission source emitting light at a wavelength of 330 to 470 nm; and a phosphor, wherein the phosphor comprises a phosphor recited in any one of the above (1) to (14).

(17) The lighting device according to the above (16), wherein the emission source comprises: an LED or an LD, and wherein the phosphor further comprises a yellow phosphor having an emission peak at a wavelength of 550 nm to 600 nm by excitation light of 330 to 420 nm.

(18) The lighting device according to the above (16) or (17), wherein the emission source comprises: the LED or the LD, and wherein the phosphor further comprises a red phosphor having an emission peak at a wavelength of 600 nm to 700 nm by excitation light of 330 to 420 nm.

(19) The lighting device according to any one of the above (16) to (18), wherein the emission source comprises: the LED or the LD, and wherein the phosphor further comprises a blue phosphor having an emission peak at a wavelength of 450 nm to 500 nm by excitation light of 330 to 420 nm.

(20) An image display device comprising: an excitation source and a phosphor, wherein the phosphor comprises: a phosphor recited in any one of a above (1) to (14).

(21) The image display device according to the above (20), comprising: any one of a fluorescent display tube (VFD), a field emission display (FED or SED), and a cathode-ray tube (CRT), wherein the excitation source is an electron beam whose acceleration voltage is from 10 V to 30 kV.

Effect of the Invention

The phosphor of the present invention may contain an AlON crystal or an AlON solid solution crystal phase, in which a metal ion to serve as an emission center is incorporated in solid solution, or a crystalline phase having the same crystal structure as the AlON. The phosphor of the present invention can enhance the emission intensity in the range of 400 nm to 550 nm as compared with the prior art sialon and oxynitride phosphors, and can therefore be expected to be excellent as a violet, blue, and green phosphors for application to a white LED. When the phosphor is exposed to the excitation source, its emission intensity is hardly lowered.

Further, it is a useful phosphor that can be used suitably in VFD, FED, SED, and CRT since it emits light efficiently upon excitation with the electron beam.

The phosphor of the present invention may contain an AlON crystal or an AlON solid solution crystal, or a crystalline phase having the same crystal structure as the AlON, in which a metal ion to serve as an emission center is incorporated in solid solution. For example, the main constituent performing the function as the phosphor may be AlON crystal or AlON solid solution crystalline phase in which a metal ion to serve as an emission center is incorporated in solid solution. The case in which the content thereof is at least 10 mass % may be included. Therefore, the phosphor of the present invention may contain, for example, one or two or more kinds of conductive substances besides such AlON crystal, AlON solid solution crystalline phase, or a crystalline phase having the same crystal structure as the AlON. Further, it is not prohibited that the phosphor contains a substance having other properties. Also, if the phosphor contains the AlON crystal, the AlON solid solution crystalline phase, or the crystalline phase having the same crystal structure as the AlON, in which a metal ion to serve as an emission center is incorporated in solid solution, the phosphor can be included in the phosphor of the present invention no matter what shape, structure, or state the phosphor is in.

Figure 1:
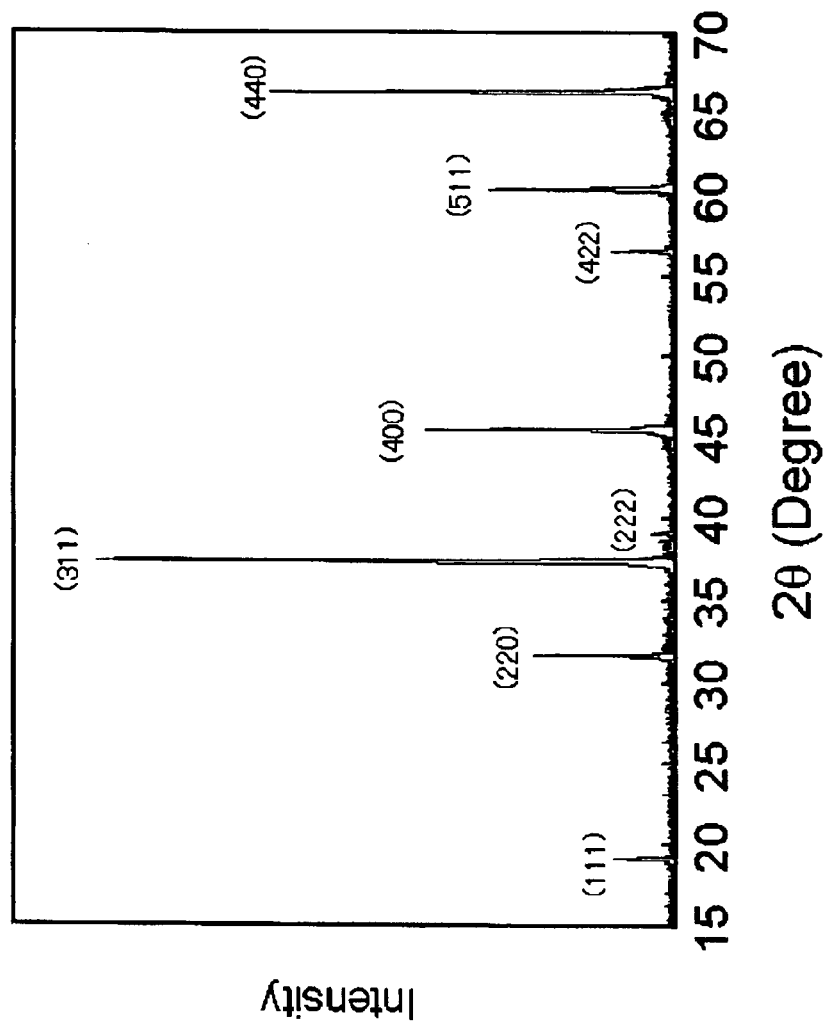
FIG. 1 shows an X-ray diffraction pattern of single phase γ-AlON.

| | Description Of Numeral References |
|---|---|
| 1 | mixture of a green phosphor of the present invention (Example 21), a yellow phosphor, and a red phosphor |
| 2 | LED chip |
| 3, 4 | conductive terminals |
| 5 | wire bond |

-continued

| | Description Of Numeral References |
|---|---|
| 6 | resin layer |
| 7 | container |
| 8 | red phosphor |
| 9 | green phosphor |
| 10 | blue phosphor |
| 11, 12, 13 | ultraviolet-emitting cells |
| 14, 15, 16, 17 | electrodes |
| 18, 19 | dielectric layer |
| 20 | protection layer |
| 21, 22 | glass substrate |
| 51 | glass |
| 52 | cathode |
| 53 | anode |
| 54 | gate |
| 55 | emitter |
| 56 | phosphor |
| 57 | electron |

DETAILED DESCRIPTION OF THE INVENTION

Best Mode for Carrying Out the Invention

In the following, embodiments of the present invention are described in detail.

The phosphor of the present invention may contain an AlON crystal, an AlON solid solution crystal, or an inorganic crystal having the same crystal structure as AlON. The AlON crystal has a cubic spinel-type crystal structure and is also called γ-AlON as described in Nonpatent Documents 4 and 5. This crystal is synthesized by mixing $Al_2O_3$ with AlN and firing the mixture at 1850° C. The AlON solid solution crystal means a crystal in which the oxygen/nitrogen ratio is altered while the crystal structure of AlON is maintained, or to which other elements are added. As the other elements added, substances including silicon, Mg, and the like, may be added. The inorganic crystal which has the same crystal structure as AlON is a crystal in which Al, O, and N are partially or completely replaced with other elements while the structure of the AlON crystal is maintained.

In the present invention, the above crystals may be used as host crystals. The AlON crystal or the AlON solid solution crystal can be identified by X-ray diffraction or neutron beam diffraction. The details of the crystal structure are described in Nonpatent Documents 4 and 5, and the crystal structure and X-ray diffraction pattern are uniquely determined from the data of lattice parameters, space groups, and atom positions as described in these documents. Not only substances which exhibit the same diffraction pattern as the pure AlON crystal or the AlON solid solution crystal, but also substances having lattice parameters altered by replacing constituent elements with other elements are included as part of the present invention.

In the present invention, the AlON crystal, the AlON solid solution crystal, or a crystal having the same crystal structure as AlON, which constitutes a host crystal, becomes a phosphor having excellent optical characteristics by incorporating an optically-active metal element M (where M is at least one kind or more of elements selected from among Mn, Ce, Pr, Nd, Sm, Eu, Gd, Tb, Dy, Tm, and Yb) in solid solution. In particular, a phosphor in which Mn, Ce, or Eu is incorporated in solid solution yields a high-brightness phosphor.

A substance into which silicon is dissolved in solid solution demonstrates excellent emission characteristics. Since Si is a tetravalent element, divalent ions such as $Eu^{2+}$ and $Mn^{2+}$ can be stabilized in the crystal so that these ions are easily introduced into the crystal as Si is incorporated in solid solution. Therefore, it is conceivable that the solid solution of Si contributes to enhancement of the phosphor brightness.

The composition of a main component inorganic crystal of the phosphor according to the present invention is expressed by compositional formula of $M_a A_b Al_c O_d N_e$ (where A is one, two, or more kinds of metal elements other than M and Al, and $a+b+c+d+e=1$) and it is preferable that the inorganic crystal is in a composition range in which parameters are selected from among values satisfying all of the following conditions.

$$0.00001 \leq a \leq 0.1 \quad (i),$$

$$0 \leq b \leq 0.40 \quad (ii),$$

$$0.10 \leq c \leq 0.48 \quad (iii),$$

$$0.25 \leq d \leq 0.60 \quad (iv), and$$

$$0.02 \leq e \leq 0.35 \quad (v).$$

Here, parameter a expresses the amount of added metal element M which constitutes a metal ion serving as an emission center, and the amount may be adjusted to 0.00001 or more and 0.1 or less in terms of an atomic ratio. Here, when two or more kinds of metal ions are employed as M, the value a expresses the total of the addition amounts of respective metal ions. When the value a is smaller than 0.00001, the number of ions to serve as the emission center is too small so that the emission brightness may be lowered. When the value a is larger than 0.1, the brightness may be lowered due to concentration quenching caused by interactions between the ions. Parameter b stands for the amount of element A (a metal element other than M and Al), and the amount may be adjusted to 0 or more and 0.40 or less in terms of the atomic ratio. If the value b deviates from the above range, bonding in the crystal becomes unstable, the formation ratio of crystalline phases other than the AlON crystal, the AlON solid solution crystal, or the crystal which has the same crystal structure as AlON may increase, thereby causing decrease of emission intensity. As the element A, Si, Mg, Ca, and the like may be selected. When no element A is included (b=0), the phosphor becomes one comprising a pure AlON crystal as a host. Since, in this case, the AlON content becomes high in compositions where the value c is 0.25 or more and 0.48 or less, a phosphor having particularly high brightness may be obtained. Parameter c stands for the amount of Al and the amount may be adjusted to 0.10 or more and 0.48 or less in terms of the atomic ratio. If the value c deviates from the above range, the formation ratio of crystalline phases other than the AlON crystal, the AlON solid solution crystal or the crystal which has the same crystal structure as the AlON may increase, thereby causing decrease of emission intensity. Parameter d stands for the amount of oxygen and the amount may be adjusted to 0.25 or more and 0.60 or less in terms of the atomic ratio. When no element A is included, the value d may be adjusted to 0.45 or more and 0.60 or less in terms of the atomic ratio. If the value d deviates from the above range, the formation ratio of crystalline phases other than the AlON crystal, the AlON solid solution crystal, or the crystal which has the same crystal structure as the AlON may increase, thereby causing decrease of emission intensity. Parameter e stands for the amount of nitrogen and the amount may be adjusted to 0.02 or more and 0.35 or less. When no element A is included, the value e may be adjusted to 0.02 or more and 0.20 or less in terms of the atomic ratio. If the value e deviates from the above range, the formation ratio of crystalline phases other than the AlON crystal, the AlON solid solution crystal, or the crystal which has the same crystal structure as the AlON may increase, thereby causing decrease of emission intensity. Further, fluorine, chlorine, or the like may be contained as non-metal ions insofar as the crystal structure of the AlON crystal, the AlON solid solution crystal, or the crystal which has the same crystal structure as the AlON is not destroyed.

If the phosphor of the present invention is used in a powder state, it is preferable that the average particle diameter is from 0.1 μm to 20 μm in consideration of dispersibility into a resin and fluidity of the substance in a powder state. The emission brightness may be improved by making the powder substance single crystalline particles in this range.

Here, in this specification, the mean particle diameter is defined as follows. In the measurement by the sedimentation method, the particle diameter is defined as the diameter of an equivalent sphere having the same sedimentation rate, and in the laser scattering method, it is defined as the diameter of an equivalent sphere having the same scattering characteristics. Further, the distribution of particle diameters is called the particle size (particle diameter) distribution. In the particle diameter distribution, a specified particle diameter is defined as the mean particle diameter D50 when the total mass of powder particles having diameters larger than the specified particle diameter is 50% of the total mass of the entire powder body. These definitions and terms are well known to the one skilled in the art and are set out in various documents such as JIS Z 8901 "Powder Body for Test and Particle for Test" and the first chapter of "Basic Physical Properties of Powder" edited by The Society of Powder Technology, Japan (ISBN4-526-05544-1). In the present invention, a specimen was dispersed in water in which sodium hexamethaphosphate was added as a dispersing agent. Then, the volume-converted integrated frequency distribution of the particle diameters was measured by using a laser scattering-type measurement instrument. Here, the volume-converted distribution is identical to the weight-converted distribution. The particle diameter corresponding to that at 50% in the integrated (cumulative) frequency distribution was obtained and defined as the mean particle diameter D50. It should be noted that, in the following part of this specification, the mean particle diameter is based on the median value (D50) of the particle size distribution measured with a particle size distribution measurement means by the above-mentioned laser scattering method. As for the means for determining the mean particle diameter, various kinds, have been developed and the development is continuing, so that the value measured by a newly developed means may differ slightly. However, it should be understood that the meaning and significance of the mean particle diameter itself is definite, and the means for measuring the mean particle diameter is not necessarily limited to the above-mentioned means.

Since the phosphor of the present invention emits light efficiently by the excitation with the ultraviolet rays or visible light having a wavelength of 100 nm or longer and 420 nm or shorter, the phosphor is suitable for application to the white LED. Moreover, the phosphor of the present invention may also be excited by an electron beam or the X-rays. Since the phosphor of the present invention, in particular, emits light more efficiently by electron beam excitation than by excitation by other nitride phosphors, the phosphor is suitable for application to the image display devices in which an electron beam is used as the excitation source.

Fluorescence having a peak at a wavelength in the range of 300 nm to 700 nm is emitted by irradiating the phosphors of the present invention with the excitation source, and the color of the emitted light differs depending on added elements.

Phosphors containing Eu as the metal element M which constitutes the metal ion show ultraviolet, violet, or blue fluorescence having a peak in the wavelength range of 350 nm to 450 nm by irradiation with an excitation source. The phosphors are efficiently excited by selecting ultraviolet light, an electron beam, X-rays, or the like as the excitation source. When the phosphors are excited by the ultraviolet light, the phosphors are, in particular, efficiently excited by the light having the wavelength range of 230 nm to 350 nm. Since the present phosphors emit light under vacuum ultraviolet radiation or radiation of a wavelength of 253.7 nm emitted by mercury atoms, the phosphors are suitable for use in plasma displays, fluorescent lamps, and mercury vapor lamps.

Phosphors containing Ce as the metal element M which constitutes the metal ion show ultraviolet, violet, or blue fluorescence having a peak in the wavelength range of 350 nm to 450 nm by irradiation with an excitation source. The phosphors are efficiently excited by selecting ultraviolet light, an electron beam, X-rays, or the like as the excitation source. When the phosphors are excited by the ultraviolet light, the phosphors are, in particular, efficiently excited by radiation of a wavelength range of 230 nm to 350 nm. Since the present phosphors emit light under vacuum ultraviolet radiation or radiation of the wavelength of 253.7 nm emitted by mercury atoms, the phosphors are suitable for use in plasma displays, fluorescent lamps, and mercury vapor lamps.

Phosphors containing Mn as the metal element M which constitutes the metal ion show blue or green fluorescence having a peak in the wavelength range of 470 nm to 570 nm by irradiation with an excitation source. The phosphors are efficiently excited by selecting the ultraviolet light, the electron beam, the X-rays, or the like as the excitation source. When the phosphors are excited by the ultraviolet light or the visible light, the phosphors are, in particular, efficiently excited by radiation of a wavelength range of 230 nm to 460 nm. Since the excitation efficiency of the light in the wavelength range of 420 nm to 450 nm is particularly high, the phosphors are suitable for use for a white or colored LED illuminating device as combined with an LED which emits the light in the above wavelength range. Since the present phosphors emit light efficiently under the electron beam, the phosphors are suitable for a green phosphor of an image display device which is excited by an electron beam, such as CRT and FED.

Phosphors containing Ce and Mn as the metal element M which constitutes the metal ion show blue or green fluorescence having a peak in the wavelength range of 470 nm to 570 nm by irradiation with an excitation source. The phosphors are efficiently excited by selecting the ultraviolet light, the electron beam, the X-rays, or the like as the excitation source. When the phosphors are excited by the ultraviolet light, the phosphors are, in particular, efficiently excited by the light of a wavelength range of 230 nm to 450 nm. Since the present phosphors emit light under vacuum ultraviolet radiation or radiation of a wavelength of 253.7 nm emitted by mercury atoms, the phosphors are suitable for use in plasma displays, fluorescent lamps, and mercury vapor lamps. The present phosphors are also suitable for use in high pressure mercury vapor lamps. The present phosphors exhibit higher emission intensity by incorporating Ce and Mn than by incorporating Mn alone. The reason for the emission improvement may be that, when Ce ions and Mn ions coexist, energy absorbed by Ce is transferred to Mn so that efficiency of Mn ion emission is enhanced. Although the mixture ratio of Ce and Mn is not particularly specified, the emission brightness of the Mn ion becomes particularly high when the value of Mn/(Ce+Mn) is 0.2 or more and 0.8 or less.

In the phosphor of the present invention, it is desirable from the viewpoint of fluorescence emission that, as a constituent thereof, the AlON crystal, the AlON solid solution crystal, or the crystal which has the same crystal structure as the AlON is highly pure, contained in a concentration as high as possible, and preferably formed in a single phase thereof, but may also be formed in a mixture with other crystalline phases or amorphous phases in a range insofar as the fluorescence characteristics do not deteriorate. In order to obtain high brightness in this case, the content of the AlON crystal, the AlON solid solution crystal, or the crystal which has the same crystal structure as AlON is preferably 10 mass % or more, more preferably 50 mass % or more. The main component of the phosphor according to the present invention contains at least 10 mass % or more of the AlON crystal, the AlON solid solution crystal, or the crystal which has the same crystal structure as the AlON. The ratio of each content can be determined by performing X-ray diffraction measurements and conducting Rietveld analysis of the AlON crystal, the AlON solid solution crystal, the crystal which has the same crystal structure as AlON, and other crystalline phases. In a simpler way, the content can be determined from the ratio of the strengths of the strongest peaks of respective phases concerning the AlON crystal, the AlON solid solution crystal, the crystal which has the same crystal structure as AlON, and other crystalline phases.

In the phosphor comprising a mixture with another crystalline phase or an amorphous phase, the phosphor can be formed from a mixture with an inorganic substance having electrical conductivity. In the VFD, FED, or the like, it is preferable that the phosphor has the electrical conductivity to some extent in order to discharge electrons outside without accumulating the electrons on the phosphor in the case where the phosphor of the present invention is excited by an electron beam. As conductive substances, oxide, oxynitride, nitride, or a mixture thereof containing one or two or more kinds of elements selected from among Zn, Ga, In, and Sn may be named. In particular, indium oxide and indium tin oxide (ITO) are desirable since the fluorescence intensity is lowered only a little, but the electrical conductivity of the phosphor is rather high.

While the respective phosphors of the present invention emit ultraviolet, blue, and green light, if it is necessary to obtain mixed light with another color such as yellow or red, another inorganic phosphor which emits light of the other color can be mixed in. Although a phosphor having an oxide, sulfide, oxysulfide, oxynitride, or nitride crystal as a host may be used as the above other inorganic phosphor, in the case where durability of the mixed phosphor is required, the phosphor having the oxynitride or nitride crystal as the host is preferable. With respect to the phosphor having the oxynitride or nitride crystal as the host, a yellow phosphor of α-sialon: Eu, a blue phosphor of α-sialon: Ce, a red phosphor of $CaAlSiN_3$: Eu or $(Ca, Sr)AlSiN_3$: Eu (phosphor in which Ca of the $CaAlSiN_3$ crystal is partially replaced with Sr), a blue phosphor of $(LaAl(Si_{6-z}Al_z)N_{10-z}O_z)$: Ce having a JEM phase as the host, a blue phosphor of $La_3Si_8N_{11}O_4$: Ce, a blue phosphor of AlN: Eu, and the like can be mentioned.

In the phosphors of the present invention, excitation spectra and fluorescence spectra vary according to compositions thereof so that it is possible to combine suitably and selectively these different phosphors in order to design phosphors emitting a variety of emission spectra. In an embodiment, the phosphor may be designed to obtain a necessary spectrum based on the application.

The method for producing the phosphor of the present invention is not particularly limited, but the following method can be set out as an example.

A raw material mixture is prepared which comprises: a metal, oxide, carbonate, nitride, fluoride, chloride, or oxynitride which contains element M (where M is at least one or more kinds of elements selected from among Mn, Ce, Pr, Nd, Sm, Eu, Gd, Tb, Dy, Tm, and Yb), or a combination thereof; and aluminum. Moreover, if needed, a metal, oxide, carbonate, nitride, fluoride, chloride, or oxynitride which contains element A (where A is a metal element other than M and Al) or a combination thereof may be added. When a solid solution is to be prepared, a metal, oxide, carbonate, nitride, fluoride, chloride, or oxynitride which contains a solid solution element or a combination thereof is further added if necessary. The raw material mixture is filled into a container with the packing fraction is maintained at 40% or less of the relative bulk density thereof. Then, the mixture is fired in a temperature range of 1500° C. or higher and 2200° C. or lower in a nitrogen atmosphere of 0.1 MPa or higher and 100 MPa or lower. In this way, the phosphor of the present invention in which at least M is incorporated in solid solution into the AlON crystal or the AlON solid solution crystal can be produced. The optimum firing temperature may vary depending on the composition, and can be optimized suitably. In general, the firing is preferably performed in the temperature range of 1700° C. or higher and 2000° C. or lower. In this way, a high-brightness phosphor is obtained. When the firing temperature is lower than 1500° C., the rate of forming the AlON crystal or AlON solid solution crystal may be low. If the firing temperature exceeds 2200° C., special equipment may be required, which is industrially undesirable.

As a starting material of the metal element M, a metal, oxide, carbonate, nitride, fluoride, chloride, or oxynitride can be used. It is preferable to use manganese carbonate or manganese oxide in the case where M is Mn, cerium oxide in the case where M is Ce, and europium oxide in the case where M is Eu.

Although silicon metal, silicon oxide, silicon nitride, organic precursor substance containing silicon, silicon diimide, an amorphous form obtained by heat-treating silicon diimide, or the like can be used as the starting material of a silicon source, the silicon nitride may generally be utilized. These materials have high reactivity and can be obtained as a synthesized compound of high purity, and further have the advantage that they are readily available because these materials are produced as industrial raw materials. As the silicon nitride, α-type, β-type, amorphous variation, and a mixture thereof can be used.

As a starting material of an aluminum source, aluminum metal, aluminum oxide, aluminum nitride, organic precursor substance containing aluminum, and the like can be used. However, it is generally preferable to use a mixture of aluminum nitride and aluminum oxide. These materials have high reactivity and can be obtained as a synthesized compound of high purity, and further have the advantage that they are readily available because the materials are produced as industrial raw materials. The amounts of aluminum nitride and aluminum oxide may be designed from the ratios of oxygen and nitrogen to an objective AlON composition.

In order to enhance reactivity in firing, an inorganic compound which forms a liquid phase at the firing temperature or below can be added to a mixture of starting materials if necessary. As the inorganic compound, a substance which produces a stable liquid phase at the reaction temperature is preferred, and a fluoride, chloride, iodide, bromide, or phosphate of Li, Na, K, Mg, Ca, Sr, Ba, or Al is suitable. The above inorganic compounds may be added separately or as a mixture of two or more kinds thereof. In particular, calcium fluoride and aluminum fluoride have high capability to enhance reactivity in the synthesis and hence are preferable. Although the amount of addition of the inorganic compound is not particularly limited to, but the amount of 0.1 weight part or more and 10 weight part or less is effectively added to 100 weight part of the mixture of the metal compounds constituting the starting materials so as to render a large effect. The reactivity is not so improved if the amount of addition is smaller than 0.1 weight part, and the brightness of the phosphor may be lowered if the amount is larger than 10 weight part. If the mixture to which the above inorganic compounds are added is fired, the reactivity is improved so that the particle growth is promoted in a comparatively short period of time so as to yield single crystals with large particle diameters, and the brightness of the phosphor becomes higher.

As the nitrogen atmosphere, a gaseous atmosphere in a pressure range that is at least 0.1 MPa and that does not exceed 100 MPa is preferable. It is more preferable that the pressure range that is at least 0.5 MPa and that does not exceed 10 MPa. When silicon nitride is used as a raw material and the firing process is performed at a temperature of 1820° C. or higher, the silicon nitride contained in the raw material decomposes easily in a nitrogen atmosphere of 0.1 MPa or lower, which is undesirable. When the nitrogen atmosphere has a pressure higher than 0.5 MPa, almost no decomposition occurs. The pressure of 10 MPa is good enough. And special equipment is required for a pressure of 100 MPa or higher, so that such pressure condition is inappropriate for the industrial production.

When fine powder of a particle diameter of several micrometers is employed as a starting material, the mixture after completion of the mixing process exhibits morphology in which the fine powder of a particle diameter of several micrometers aggregates to a size of several hundreds of micrometers to several millimeters (hereinafter called powder aggregate). In the present invention, the powder aggregate is fired in a state with the packing fraction maintained in a bulk density that does not exceed 40%. More preferably, it is maintained in the bulk density that does not exceed 20%. Here, the term "relative bulk density" means the ratio of a value (bulk density) given by dividing the mass of powder material packed in the container by the capacity of the container to the real density of the substance of the powder material. In a typical sialon production, a hot pressing method in which heating is conducted as it is pressurized or a manufacturing method of firing after die molding (powder compacting) is employed, and hence the firing process is conducted in a state where the powder packing fraction is high. In the present invention, however, the powder aggregate of a mixture in which the particle size is made uniform is charged into a vessel or the like with a packing fraction of a bulk density that does not exceed 40% without applying any mechanical force or without molding with a die in advance. If necessary, the powder aggregate may be subjected to particle size control by granulating to an average particle diameter that does not exceed 500 μm by using a sieve or an air classifier. Otherwise, the powder aggregate may be granulated directly into a shape of 500 μm or smaller by using a spray dryer. A vessel of boron nitride has an advantage of little reactivity with the phosphor.

The reason why the firing process is performed while the bulk density is maintained not to exceed 40% is to fire the raw material powder while a free space is maintained around the raw material powder. The optimal bulk density depends on the shapes and surface conditions of the granulated particles, but it is typically preferable for it not to exceed 20%. In this way, crystals of reaction products grow in a free space, so that it is likely that the crystals have smaller chance to come into contact with each other, whereby crystals with a smaller number of surface defects are synthesized. Therefore, a high-brightness phosphor may be obtained. And powder products with fine particles are unlikely to be obtained. The size of the powder aggregate of 500 μm or smaller is particularly preferable to achieve excellent grinding properties after the firing. When the bulk density exceeds 40%, partial densification takes place during the firing so that a dense sintered body appears, which hinders crystal growth. As a result, the brightness of the phosphor may be reduced.

Then, the powder aggregate having a packing fraction of 40% or smaller is fired under the above condition. The furnace used for firing is preferably heated by metal resistance heating or graphite resistance heating, and carbon is preferably used as the high temperature part of the furnace because the firing temperature is high and nitrogen is employed as the firing atmosphere. For firing, a sintering method in which no mechanical pressure is applied from the outside, such as normal pressure sintering and gas pressure sintering, is desirable for performing firing while maintaining the bulk density in a predetermined range.

When the powder aggregate obtained by firing is solidified hard, the aggregate is ground by using a mill ordinarily employed in the factory, such as a ball mill, jet mill, or the like. Among these, ball milling enables the easiest control of the particle size. A silicon nitride sintered body or a sialon sintered body is preferable as the materials of balls and pots for the present purpose. Grinding is continued until an average particle diameter of 20 μm or smaller is reached. Particularly desirable average particle diameter is at least 20 nm and does not exceed 10 μm. When the average particle diameter exceeds 20 μm, the fluidity of the powder and dispersion into resin deteriorate, and emission intensity may become nonuniform from part to part when a light emitting device is built by combining the phosphor with a light-emitting device. When the average particle diameter is less than 20 nm, it becomes more difficult to handle the phosphor powder. If an objective particle diameter is not obtained by grinding alone, classification may be used in combination with the grinding. Sieving, air classification, and settling in a liquid may be employed as the means of classification.

Further, by washing the fired compound with a solvent for dissolving these inorganic compounds after the firing, the contents of the inorganic compounds such as glass phases, a second phase, or impurity phases other than the phosphor contained in the reaction product is reduced so that the brightness of the phosphor is improved. As such solvent, water and aqueous solution of an acid can be used. As the aqueous solution of the acid, sulfuric acid, hydrochloric acid, nitric acid, hydrofluoric acid, a mixture of organic acid and hydrofluoric acid, or the like can be used. In particular, the mixture of sulfuric acid and hydrofluoric acid achieves a large effect. This processing is quite effective with respect to a reaction product fired at a high temperature wherein the inorganic compounds yielding a liquid phase at the firing temperature or lower have been added to the product in advance.

Although fine phosphor powder is obtained through the above processes, heat treatment is effective in order to further improve the brightness. For this purpose, the powder after firing or the powder after particle size adjustment by pulverization and classification can be subject to heat treatment at a temperature that is at least 1000° C. and less than the firing temperature. At a temperature lower than 1000° C., the effect of removing surface defects is relatively low. A temperature higher than or equal to the firing temperature is undesirable because particles of the ground phosphor aggregate again with each other. The atmosphere suitable for heat treatment depends on phosphor compositions. As for an atmosphere suitable for the heat treatment, a mixed atmosphere including one or more gases selected from among nitrogen, air, ammonia, and hydrogen can be used. Among these, a nitrogen atmosphere is particularly preferable since this atmosphere exhibits a pronounced effect of removing defects.

The thus-obtained phosphor of the present invention is characterized by high brightness of a visible light emission as compared with an ordinary oxide phosphor and sialon phosphor of the prior art. A phosphor of a specific composition, in particular, is characterized by emission of a violet, blue, or green light and hence is suitable for lighting devices and image display devices. Further, the phosphor of the present invention does not deteriorate even when exposed to high temperatures and thus has superior thermal resistance, and excels in a long-term stability in an oxidizing atmosphere and humid environment.

The lighting device of the present invention is configured with at least a light-emitting source and the phosphor of the present invention. Acceptable lighting devices include, for example, the LED lighting device and the fluorescent lamp. The LED lighting device can be manufactured using the phosphor of the present invention and a publicly known method described, for example in Japanese Patent Application Publication No. H05-152609, Japanese Patent Application Publication No. H07-99345, or Japanese Patent No. 2927279. In this case, a light-emitting source which emits light with a wavelength of 330 to 420 nm is preferred and in particular an LED or LD emission device emitting ultraviolet (or violet) light with a wavelength of 330 to 420 nm is especially preferred.

Such a light-emitting device includes those devices comprised of a nitride semiconductor such as GaN, InGaN, or the like, which can constitute a light-emitting source for emitting light with a predetermined wavelength by adjusting the composition thereof.

A lighting device which emits light of a desired color can be constructed using in combination a phosphor having other light-emitting properties rather than using the phosphor of the present invention alone. As an example thereof can be mentioned a combination of: an LED or LD light-emitting device which emits ultraviolet light of 330 to 420 nm; a yellow phosphor which is excited by the light of this wavelength so as to emit light having an emission peak at a wavelength region that is at least 550 nm and that does not exceed 600 nm; and a (violet, blue, or green) phosphor of the present invention. For such yellow phosphor, α-sialon: $Eu^{2+}$ disclosed in Japanese Patent Application Publication No. 2002-363554 and (Y, Gd)$_2$(Al, Ga)$_5$O$_{12}$: Ce disclosed in Japanese Patent Application Publication No. 09-218149 may be utilized. In such configuration, when the ultraviolet light emitted by the LED or LD irradiates the phosphors, light of two colors: violet, blue, or green; and yellow is emitted so as to produce a white color lighting device by mixing these two colors.

As another example can be mentioned an LED or LD light-emitting device which emits ultraviolet light of 330 to 420 nm; a blue phosphor which is excited by the light of this wavelength and emits light having an emission peak in the range that is at least 430 nm and does not exceed 500 nm; a red phosphor which emits light having an emission peak in the range that is at least 600 nm and does not exceed 700 nm; and a phosphor (e.g., a green phosphor) of the present invention. For such blue phosphor, for example, BaMgAl$_{10}$O$_{17}$: $Eu^{2+}$ can be utilized, and for the red phosphor, CaSiAlN$_3$: $Eu^{2+}$ described in WO2005/052087 pamphlet can also be utilized. In such configuration, when the ultraviolet light emitted by the LED or LD irradiates the phosphors, light of three colors: red, green, and blue is emitted so as to produce a white color lighting device by mixing these three colors.

As another means, an LED or LD light-emitting device which emits ultraviolet light of 330 to 420 nm; a blue phosphor which is excited by the light of this wavelength and emits light having an emission peak in a wavelength range that is at least 430 nm and does not exceed 500 nm; a yellow phosphor which is excited by the light of this wavelength and emits light having an emission peak in a wavelength range that is at least 550 nm and does not exceed 600 nm; a red phosphor which is excited by the light of this wavelength and emits light having an emission peak in a wavelength range that is at least 600 nm and does not exceed 700 nm; and the phosphor (e.g., green) of the present invention can be combined. For such blue phosphor, BaMgAl$_{10}$O$_{17}$: $Eu^{2+}$ can be utilized. For such yellow phosphor, α-sialon: $Eu^{2+}$ disclosed in Japanese Patent Application Publication No. 2002-363554 and (Y, Gd)$_2$(Al, Ga)$_5$O$_{12}$: Ce disclosed in Japanese Patent Application Publication No. 09-218149 may be utilized. For the red phosphor, CaSiAlN$_3$: $Eu^{2+}$ described in WO2005/052087 pamphlet can also be utilized. In this configuration, when the ultraviolet light which the LED or LD emits irradiates the phosphor, light of four colors: blue, green, yellow, and red is emitted so as to produce a white or reddish electric bulb color lighting device by mixing these three colors.

It should be understood that the combination of phosphors for the lighting device are not limited to the aforementioned. For example, when a phosphor of the present invention emits blue light, the phosphor of the present invention and the above-mentioned red phosphor may be combined, the phosphor of the present invention, the above-mentioned red phosphor, and the above-mentioned yellow phosphor may be combined, or the phosphor of the present invention, the above-mentioned red phosphor, the above-mentioned yellow phosphor; and a green phosphor (for example, β-sialon: $Eu^{2+}$ as described in Japanese Patent Application Publication No. 2005-255895) may be combined. When a phosphor of the present invention emits green light, the phosphor of the present invention, the above-mentioned yellow phosphor, and the above-mentioned blue phosphor can be combined.

The image display device of the present invention comprises: at least an excitation source and the phosphor of the present invention, and includes a vacuum fluorescent display (VFD), a field emission display (FED or SED), a plasma display panel (PDP), a cathode-ray tube (CRT), or the like. It has been confirmed that the phosphor of the present invention emits light by excitation of 100 to 190 nm vacuum ultraviolet light, 190 to 380 nm ultraviolet light, an electron beam, or the like, and the above image display devices are constructed by combining these excitation sources and the phosphor of the present invention.

Since the phosphor of the present application is excellent in the excitation efficiency of the electron beam, it is suitable for the application to the VFD, FED, SED, and CRT, in which the acceleration voltage of the electron beam is 10 V or higher and 30 kV or lower.

The FED is an image display device in which luminescence is produced by bombarding the phosphor applied on the anode with electrons emitted and accelerated from the field emission cathode and it is required that the luminescence be made with an acceleration voltage not exceeding 5 kV so that the display device will be improved in the luminescence performance by combining the phosphor of the present invention.

The present invention is described in more detail with examples to be shown below. However, these examples are disclosed only to facilitate the understanding of the present invention with ease. Therefore, the present invention is not limited to these examples.

EXAMPLES 1 TO 43

As powdery raw materials, aluminum nitride powder having a specific surface area of 3.3 m²/g and an oxygen content of 0.79% (Tokuyama Corp., F grade), aluminum oxide powder of 99.99% purity having a specific surface area of 13.6 m²/g (Taimei Chemicals Co., Ltd., Taimicron grade), manganese carbonate powder of 99.9% purity (Kojundo Chemical Lab. Co., Ltd., reagent grade), and europium oxide powder and cerium oxide powder of 99.9% purity (Shin-etsu Chemical Co., Ltd.) were used.

First, in order to synthesize $Al_7O_9N$, which is the theoretical composition of AlON, powdery $Al_2O_3$ and AlN materials were weighed so that a composition of 75 mol % $Al_2O_3$-25 mol % AlN was obtained. After mixing the weighed composition with a mortar and pestle made of silicon nitride, the resultant mixture was charged into a boron nitride crucible having a diameter of 20 mm and a height of 20 mm, and the charged crucible was set into a graphite resistance heating-type electric furnace. Firing operations were conducted as follows. First, the firing atmosphere was evacuated with a diffusion pump, and then heated from room temperature to 800° C. at a rate of 500° C./h. Thereafter, nitrogen having a purity of 99.9995 vol % was introduced at 800° C. to set the gas pressure to 1 MPa, and the temperature was raised to 1800° C. at 500° C./h and maintained at 1800° C. for 4 hours. The fired powder was ground with a mortar and pestle made of silicon nitride, and subjected to powder X-ray diffraction measurements (XRD) using the Cu Kα line. Consequently, the formation of substantially single-phase γ-type AlON was confirmed, as shown in FIG. 1.

Figure 2:
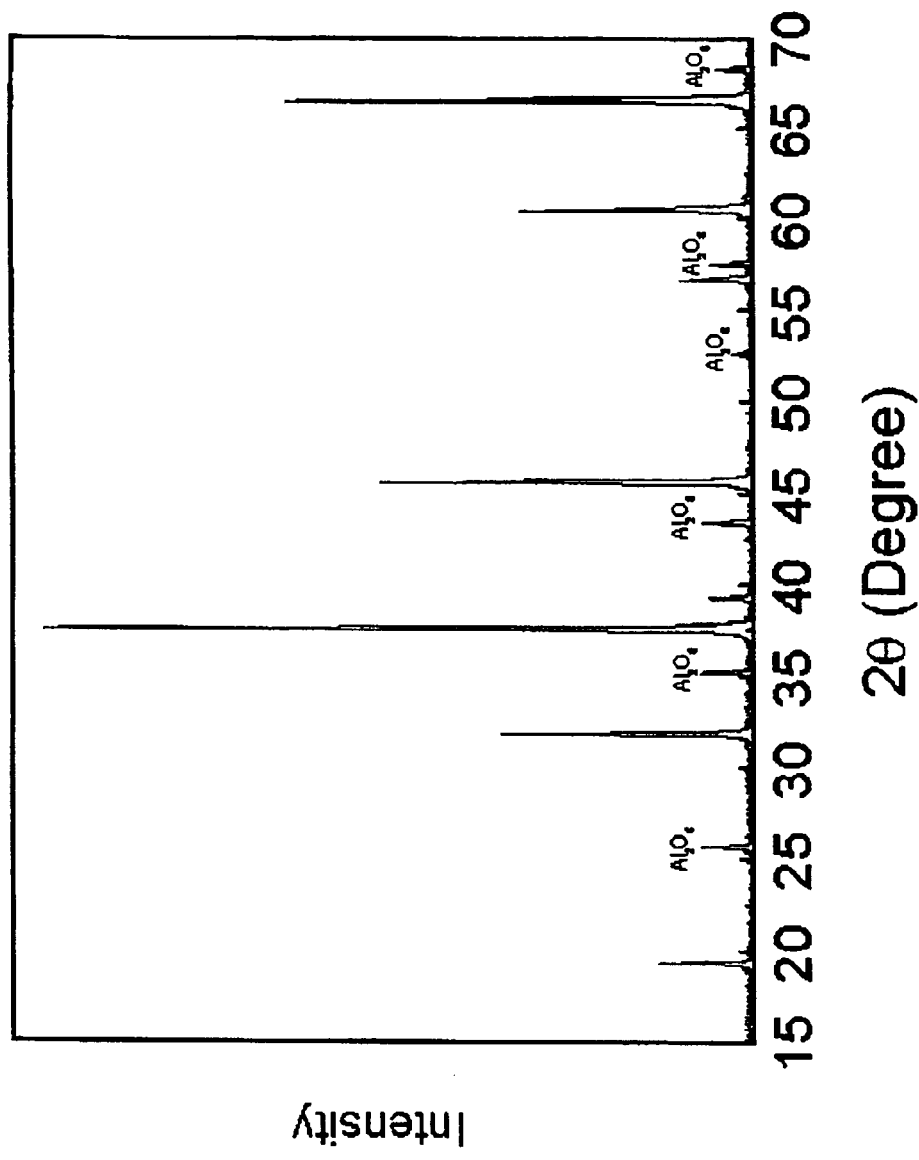
FIG. 2 shows an X-ray diffraction pattern of Example 21.
Figure 3:
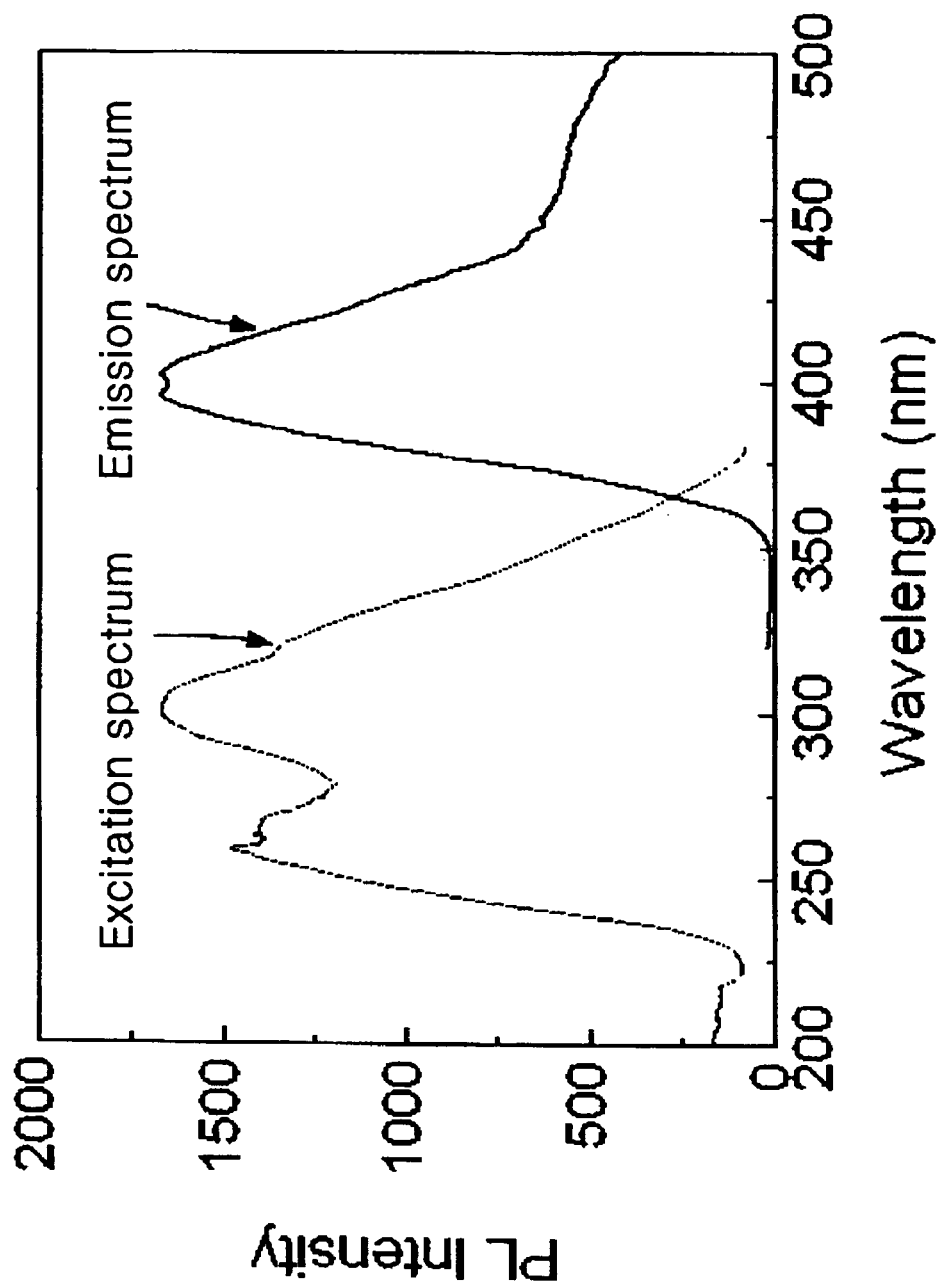
FIG. 3 shows an excitation spectrum and an emission spectrum by fluorescence measurement of Example 10.
Figure 4:
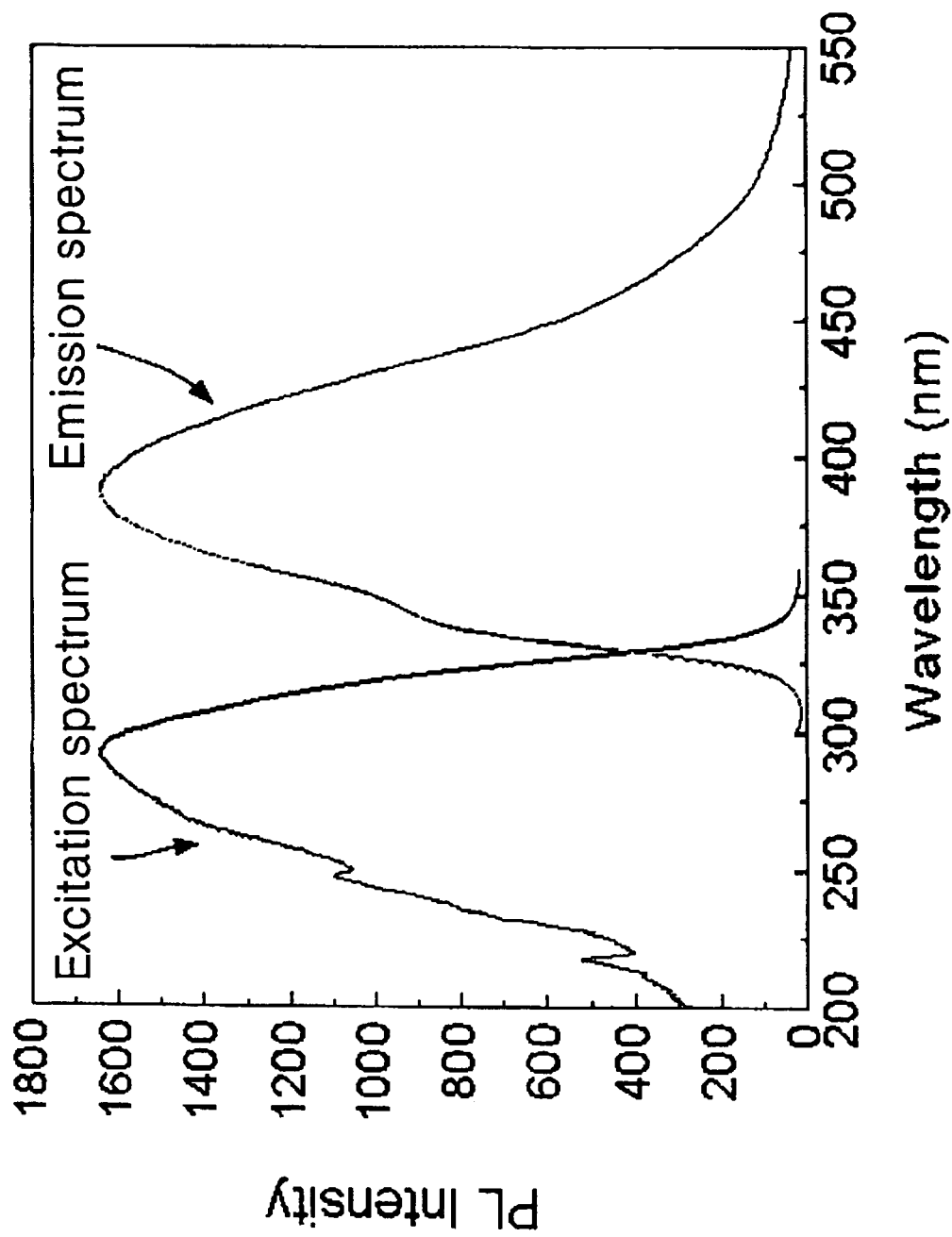
FIG. 4 shows an excitation spectrum and an emission spectrum by fluorescence measurement of Example 21.
Figure 5:
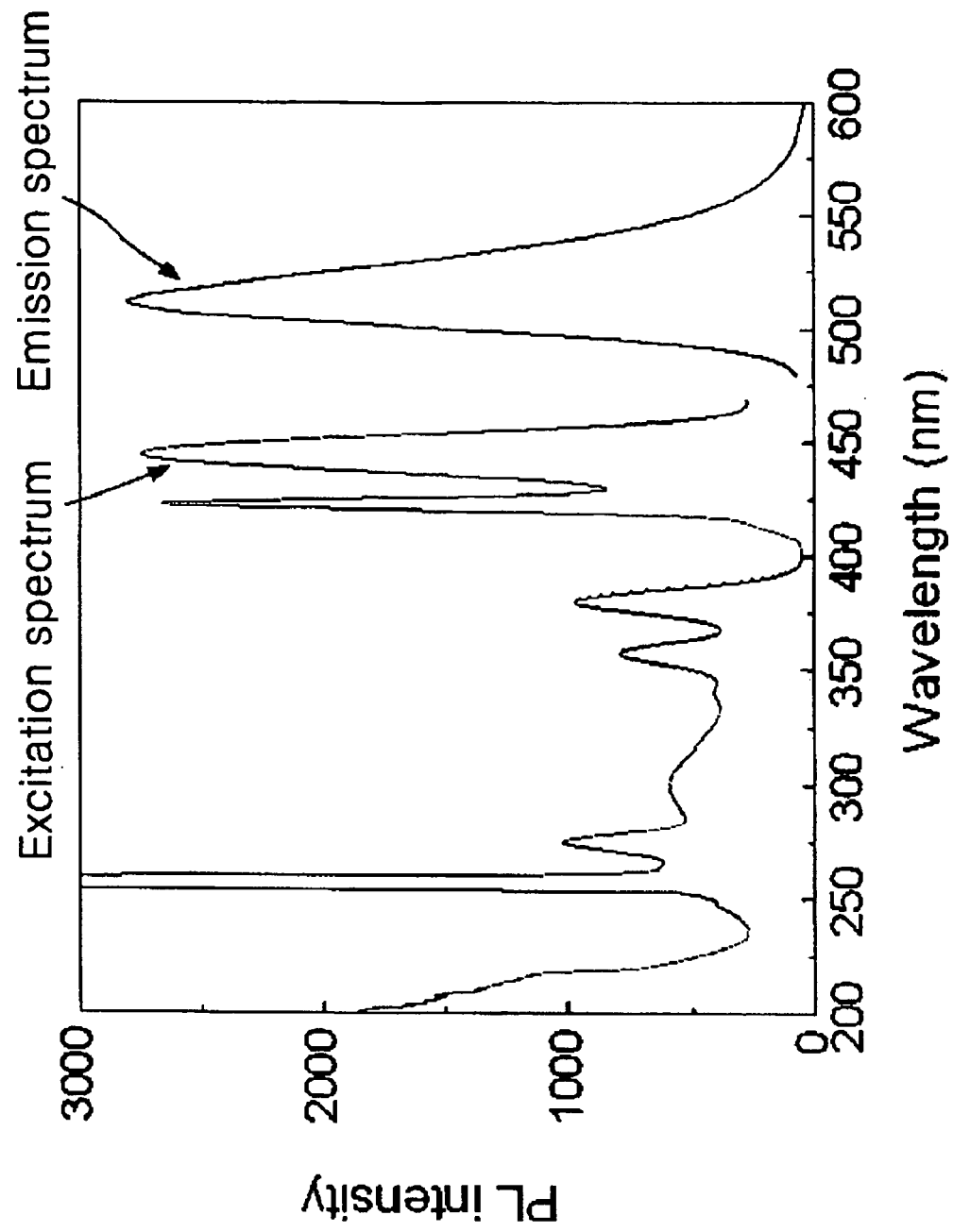
FIG. 5 shows an excitation spectrum and an emission spectrum by fluorescence measurement of Example 23.
Figure 6:
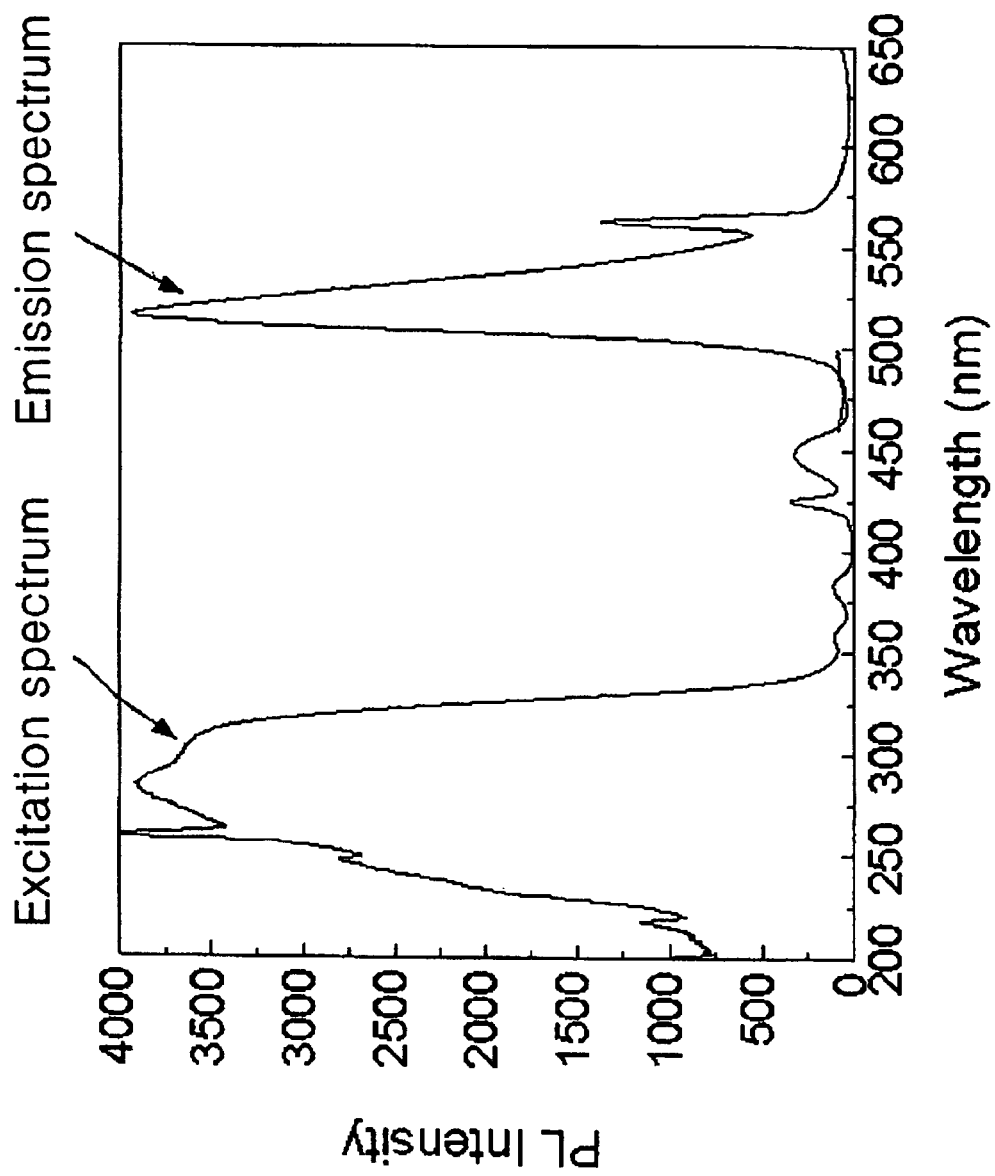
FIG. 6 shows an excitation spectrum and an emission spectrum by fluorescence measurement of Example 29.

Next, phosphors containing metal element M were synthesized. Table 1 summarizes design compositions of Examples 1 to 43. In order to obtain compounds represented by the design compositional formula $M_aA_bAl_cO_dN_e$O (a+b+c+d+e=1) shown in Table 1, powdery raw materials were weighed in mass ratios shown in Table 2. After mixing the weighed raw materials with a mortar and pestle made of a silicon nitride sintered compact, the resultant mixture was passed through a sieve with an opening of 125 μm to obtain a powder aggregate having excellent fluidity. By allowing the powder aggregate to spontaneously fall into a boron nitride crucible having a diameter of 20 mm and a height of 20 mm, a bulk density of 15 to 30 vol % was obtained. The bulk density was calculated from the weight of the powder aggregate charged into the crucible, the internal volume of the crucible and the true density of the powder. Next, the crucible was set into a graphite resistance heating-type electric furnace. Firing operations were conducted as follows. First, the firing atmosphere was evacuated with a diffusion pump, and then heated from room temperature to 800° C. at a rate of 500° C./h. Thereafter, gaseous nitrogen having a purity of 99.9995 vol. % was introduced at 800° C. to set the gas pressure to 1 MPa, and the temperature was raised to 1800° C. at a rate of 500° C./h and maintained at 1800° C. for 4 hours. The synthesized samples were ground with a mortar and pestle which were made of silicon nitride, and subjected to powder X-ray diffraction measurements (XRD) using the Cu Kα line. FIG. 2 shows the result of X-ray diffraction of Example 21. The generation of crystals of the γ-type AlON structure and a second phase of aluminum oxide was confirmed. From the ratio of the heights of main peaks, the formation ratio of the crystal of the γ-type AlON structure was judged to be 90% or more. Also in other test samples, the formation of crystals of the γ-type AlON structure was verified. Some test samples were not single phase products but, judging by the ratio of the main peak heights, about 10% of an aluminum oxide second phase was mixed in.

TABLE 1

Designed Composition

| Example | a Mn | a Ce | a Eu | b A | c Al | d O | e N |
|---|---|---|---|---|---|---|---|
| 1 |  | 0.022 |  |  | 40.685 | 55.755 | 3.538 |
| 2 |  | 0.023 |  |  | 40.886 | 54.549 | 4.543 |
| 3 |  | 0.024 |  |  | 41.152 | 52.945 | 5.879 |
| 4 |  | 0.024 |  |  | 41.438 | 51.225 | 7.313 |
| 5 |  | 0.025 |  |  | 41.746 | 49.374 | 8.855 |
| 6 |  | 0.012 |  |  | 41.164 | 52.943 | 5.881 |
| 7 |  | 0.047 |  |  | 41.128 | 52.949 | 5.875 |
| 8 |  | 0.118 |  |  | 41.055 | 52.962 | 5.865 |
| 9 |  | 0.236 |  |  | 40.933 | 52.983 | 5.848 |
| 10 |  | 1.201 |  |  | 39.940 | 53.153 | 5.706 |
| 11 |  | 1.696 |  |  | 39.431 | 53.240 | 5.633 |
| 12 |  | 2.454 |  |  | 38.650 | 53.374 | 5.521 |
| 13 |  | 2.970 |  |  | 38.119 | 53.465 | 5.446 |
| 14 |  | 3.762 |  |  | 37.304 | 53.605 | 5.329 |
| 15 | 0.012 |  |  |  | 41.167 | 52.940 | 5.881 |
| 16 | 0.024 |  |  |  | 41.157 | 52.940 | 5.880 |
| 17 | 0.047 |  |  |  | 41.138 | 52.938 | 5.877 |
| 18 | 0.118 |  |  |  | 41.079 | 52.934 | 5.868 |
| 19 | 0.237 |  |  |  | 40.982 | 52.927 | 5.855 |
| 20 | 1.208 |  |  |  | 40.181 | 52.870 | 5.740 |
| 21 | 1.710 |  |  |  | 39.768 | 52.841 | 5.681 |
| 22 | 2.484 |  |  |  | 39.130 | 52.795 | 5.590 |
| 23 |  |  | 0.022 |  | 40.690 | 55.750 | 3.538 |
| 24 |  |  | 0.012 |  | 41.453 | 51.219 | 7.315 |
| 25 | 3.020 | 0.126 |  |  | 38.560 | 52.786 | 5.509 |
| 26 | 3.024 | 0.252 |  |  | 38.426 | 52.808 | 5.489 |
| 27 | 3.044 | 0.761 |  |  | 37.887 | 52.896 | 5.412 |
| 28 | 3.063 | 1.276 |  |  | 37.340 | 52.986 | 5.334 |
| 29 | 3.082 | 1.798 |  |  | 36.787 | 53.077 | 5.255 |
| 30 | 0.120 | 1.204 |  |  | 39.838 | 53.147 | 5.691 |
| 31 | 0.241 | 1.207 |  |  | 39.735 | 53.140 | 5.676 |
| 32 | 1.231 | 1.231 |  |  | 38.895 | 53.086 | 5.556 |
| 33 | 1.741 | 1.244 |  |  | 38.462 | 53.058 | 5.495 |
| 34 | 2.526 | 1.263 |  |  | 37.796 | 53.015 | 5.399 |
| 35 | 1.772 |  | 0.025 |  | 39.973 | 51.176 | 7.054 |
| 36 | 1.775 |  | 0.127 |  | 39.886 | 51.173 | 7.039 |
| 37 | 1.779 |  | 0.254 |  | 39.777 | 51.170 | 7.020 |
| 38 | 1.796 |  | 0.770 |  | 39.336 | 51.157 | 6.942 |
| 39 | 0.123 |  | 0.246 |  | 41.158 | 51.211 | 7.263 |
| 40 | 0.246 |  | 0.246 |  | 41.055 | 51.207 | 7.245 |
| 41 | 0.747 |  | 0.249 |  | 40.638 | 51.195 | 7.171 |
| 42 | 1.258 |  | 0.252 |  | 40.212 | 51.183 | 7.096 |
| 43 | 2.582 |  | 0.258 |  | 39.108 | 51.150 | 6.901 |
| 44 | 0.974 |  |  | 19.400 | 21.900 | 28.000 | 29.700 |
| 45 | 0.536 |  |  | 35.600 | 11.500 | 50.300 | 2.030 |
| 46 | 0.536 |  |  | 35.600 | 11.500 | 50.300 | 2.030 |

TABLE 2

Raw Material Mixture Composition (wt %)

| Example | AlN | Al2O3 | MnCO3 | CeO2 | Eu2O3 |
|---|---|---|---|---|---|
| 1 | 7.099 | 92.714 |  | 0.187 |  |
| 2 | 9.115 | 90.693 |  | 0.192 |  |
| 3 | 11.793 | 88.009 |  | 0.198 |  |
| 4 | 14.667 | 85.127 |  | 0.206 |  |
| 5 | 17.756 | 82.031 |  | 0.213 |  |
| 6 | 11.804 | 88.096 |  | 0.100 |  |
| 7 | 11.770 | 87.834 |  | 0.396 |  |
| 8 | 11.700 | 87.313 |  | 0.987 |  |
| 9 | 11.584 | 86.450 |  | 1.966 |  |

TABLE 2-continued

| Example | Raw Material Mixture Composition (wt %) | | | | |
|---|---|---|---|---|---|
| | AlN | Al2O3 | MnCO3 | CeO2 | Eu2O3 |
| 10 | 10.699 | 79.842 | | 9.459 | |
| 11 | 10.281 | 76.721 | | 12.998 | |
| 12 | 9.682 | 72.249 | | 18.069 | |
| 13 | 9.300 | 69.399 | | 21.301 | |
| 14 | 8.751 | 65.308 | | 25.941 | |
| 15 | 11.809 | 88.121 | 0.070 | | |
| 16 | 11.801 | 88.069 | 0.130 | | |
| 17 | 11.785 | 87.945 | 0.270 | | |
| 18 | 11.738 | 87.602 | 0.660 | | |
| 19 | 11.661 | 87.019 | 1.320 | | |
| 20 | 11.046 | 82.434 | 6.520 | | |
| 21 | 10.744 | 80.186 | 9.070 | | |
| 22 | 10.300 | 76.860 | 12.840 | | |
| 23 | 7.099 | 92.711 | | | 0.190 |
| 24 | 14.681 | 85.219 | | | 0.100 |
| 25 | 9.905 | 73.915 | 15.230 | 0.950 | |
| 26 | 9.804 | 73.156 | 15.150 | 1.890 | |
| 27 | 9.407 | 70.209 | 14.830 | 5.554 | |
| 28 | 9.027 | 67.364 | 14.540 | 9.069 | |
| 29 | 8.663 | 64.642 | 14.250 | 12.445 | |
| 30 | 10.626 | 79.303 | 0.630 | 9.441 | |
| 31 | 10.554 | 78.761 | 1.260 | 9.425 | |
| 32 | 9.986 | 74.512 | 6.210 | 9.292 | |
| 33 | 9.707 | 72.436 | 8.630 | 9.227 | |
| 34 | 9.296 | 69.373 | 12.200 | 9.131 | |
| 35 | 13.291 | 77.139 | 9.360 | | 0.210 |
| 36 | 13.178 | 76.482 | 9.320 | | 1.020 |
| 37 | 13.038 | 75.662 | 9.270 | | 2.030 |
| 38 | 12.492 | 72.508 | 9.060 | | 5.940 |
| 39 | 14.292 | 82.948 | 0.680 | | 2.080 |
| 40 | 14.193 | 82.387 | 1.350 | | 2.070 |
| 41 | 13.802 | 80.108 | 4.030 | | 2.060 |
| 42 | 13.416 | 77.874 | 6.670 | | 2.040 |
| 43 | 12.478 | 72.432 | 13.090 | | 2.000 |

As a result of irradiating the thus-obtained powder samples with a lamp which emitted light of a wavelength of 254 nm, light emission in the range of violet to green was confirmed. The emission spectra and excitation spectra of these powder samples were measured using a spectrophotofluorometer. Table 3 summarizes the results of excitation peak wavelengths, emission peak wavelengths, and fluorescence emission intensities obtained in the photoluminescence measurements of Examples 1 to 43. As shown in Table 3, these powder samples are phosphors which have the peak of the excitation spectrum in the wavelength range of 280 nm to 450 nm, and the peak of the emission spectrum in the wavelength range of 390 nm to 520 nm under excitation at the peak wavelength of the excitation spectrum. Since the emission intensity (counted value) of the excitation spectrum and the emission spectrum changes depending on the measuring instruments or conditions, the intensity is expressed in an arbitrary unit. That is, the values can be compared only within the present Examples measured under the same conditions. FIGS. 3 to 6 show the excitation and emission spectra of Example 10, Example 21, Example 23 and Example 29, respectively. In the present drawings, peaks exceeding the display range of the vertical axes indicate the direct light or second-order light of excitation light which does not belong to the original spectra, and may hence be disregarded. Since a 1/10 neutral density filter was used in the measurements of FIGS. 5 and 6, actual emission intensities (counted values) are 10 times the value shown in the drawings.

TABLE 3

| Example | Excitation Wavelength (nm) | Emission Wavelength (nm) | Emission Intensity (Arbitrary unit) |
|---|---|---|---|
| 1 | 304 | 393 | 2280 |
| 2 | 306 | 402 | 2236 |
| 3 | 306 | 405 | 2054 |
| 4 | 306 | 404 | 1880 |
| 5 | 306 | 403 | 1220 |
| 6 | 306 | 404 | 2287 |
| 7 | 302 | 406 | 3038 |
| 8 | 282 | 371 | 5058 |
| 9 | 282 | 378 | 7628 |
| 10 | 293 | 388 | 16440 |
| 11 | 290 | 386 | 13510 |
| 12 | 292 | 387 | 11800 |
| 13 | 292 | 392 | 11010 |
| 14 | 292 | 394 | 7680 |
| 15 | 444 | 509 | 1186 |
| 16 | 444 | 510 | 1545 |
| 17 | 444 | 511 | 1384 |
| 18 | 444 | 510 | 1163 |
| 19 | 444 | 510 | 1479 |
| 20 | 444 | 511 | 2448 |
| 21 | 444 | 511 | 2800 |
| 22 | 444 | 511 | 2410 |
| 23 | 300 | 403 | 4800 |
| 24 | 364 | 503 | 1204 |
| 25 | 280 | 516 | 23950 |
| 26 | 280 | 517 | 26130 |
| 27 | 281 | 516 | 36000 |
| 28 | 281 | 516 | 38320 |
| 29 | 283 | 516 | 39380 |
| 30 | 282 | 516 | 28990 |
| 31 | 283 | 516 | 29280 |
| 32 | 283 | 516 | 30830 |
| 33 | 283 | 516 | 34170 |
| 34 | 283 | 516 | 37640 |
| 35 | 306 | 516 | 6994 |
| 36 | 306 | 516 | 4765 |
| 37 | 306 | 516 | 4728 |
| 38 | 306 | 515 | 1577 |
| 39 | 305 | 514 | 3067 |
| 40 | 304 | 514 | 3025 |
| 41 | 304 | 515 | 3932 |
| 42 | 304 | 515 | 5273 |
| 43 | 304 | 514 | 4915 |

Figure 7:
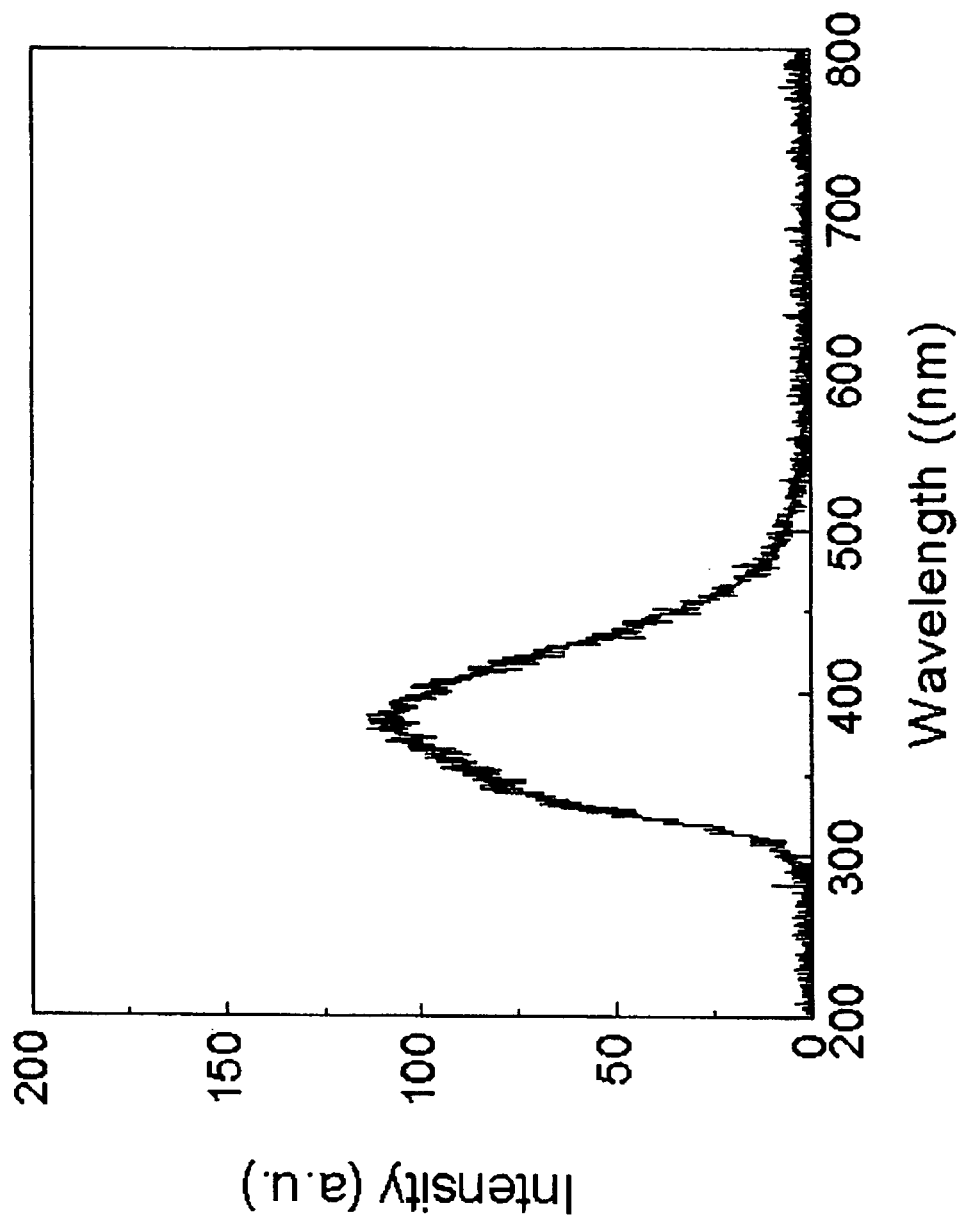
FIG. 7 shows a cathodoluminescence spectrum by the electron beam excitation of Example 10.
Figure 8:
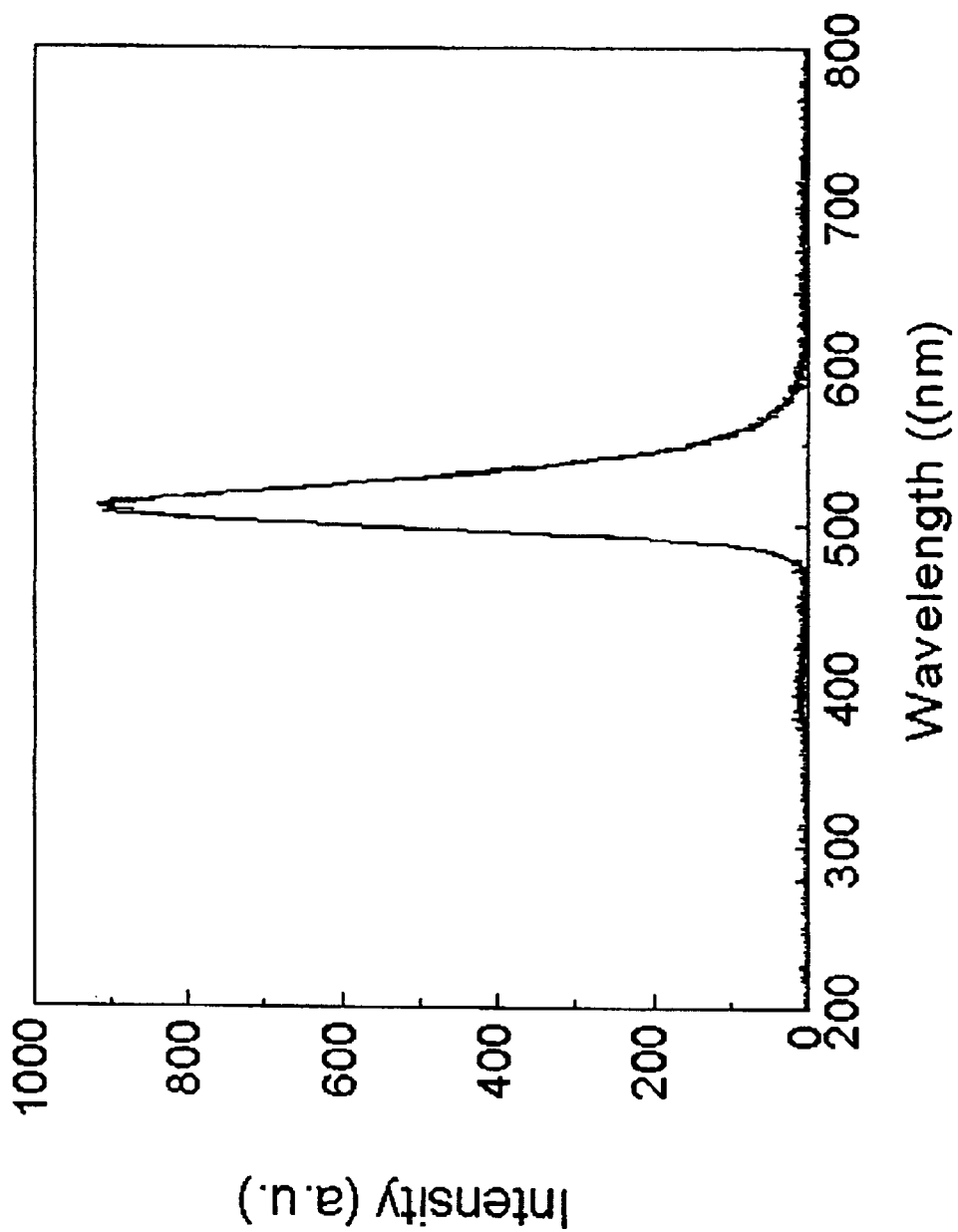
FIG. 8 shows a cathodoluminescence spectrum by the electron beam excitation of Example 21.

Luminescence characteristics (cathodoluminescence, CL) under electron beam irradiation were observed using a scanning electron microscope (SEM) equipped with a CL detector, and CL images were evaluated. This apparatus shows clearly the wavelength of light emitted at any location by detecting visible light generated by electron beam irradiation and obtaining a photographic image constituting two-dimensional information. FIGS. 7 and 8 show the CL spectra of Example 10 and Example 21 at an acceleration voltage of 5 kV, respectively. It was confirmed by emission spectrum observation that these phosphors emit blue light by electron beam excitation. Since the emission intensity of the present measurements changes with measuring instruments or conditions, the intensity is expressed in an arbitrary unit.

Example 44 TO 46

The same powdery raw materials as employed in Examples 1 to 43, silicon nitride powder having a mean particle diameter of 0.5 μm, oxygen content of 0.93 wt. %, and α-type content of 92% (Ube Industries, Ltd., E10 grade), calcium carbonate powder of 99.9% purity (Kojundo Chemical Laboratory, Co., Ltd., reagent grade), and magnesium oxide powder (Konoshima Chemical Co., Ltd.) were used. Table 1 also summarizes design compositions of Examples 44 to 46.

In Example 44, in order to synthesize a composition of $Mn_{0.974}Si_{19.4}Al_{21.9}O_{28}N_{29.7}$, powdery raw materials were weighed in a proportion of 5.34 mass % $MnCO_3$, 43.3 mass % $Si_3N_4$, 7.55 mass % AlN, and 43.83 mass % $Al_2O_3$.

In Example 45, in order to synthesize a composition $Mn_{0.536}Mg_{35.6}Al_{11.5}O_{50.3}N_{2.03}$, powdery raw materials were weighed in a proportion of 2.99 mass % $MnCO_3$, 67.57 mass % MgO, 4.033 mass % AlN, and 23.41 mass % $Al_2O_3$.

In Example 46, in order to synthesize a composition of $Mn_{0.536}Ca_{35.6}Al_{11.5}O_{50.3}N_{2.03}$, powdery raw materials were weighed in a proportion of 1.47 mass % $MnCO_3$, 85.03 mass % $CaCO_3$, 1.985 mass % AlN, and 11.52 mass % $Al_2O_3$.

After mixing the weighed powder materials with a mortar and pestle made of silicon nitride, the resultant mixture was charged into a boron nitride crucible having a diameter of 20 mm and a height of 20 mm, and the charged crucible was set into a graphite resistance heating-type electric furnace. In the firing operations, the firing atmosphere was first vacuumized with a diffusion pump, and then heated at a rate of 500° C./h from room temperature to 800° C. Thereafter, gaseous nitrogen having a purity of 99.9995 vol % was introduced at 800° C. to set the gas pressure to 1 MPa, and the temperature was raised to 1800° C. at 500° C./h and maintained at 1800° C. for 4 hours. The fired powder was ground using a mortar and pestle made of silicon nitride, and subjected to powder X-ray diffraction measurements (XRD) using the Cu Kα line. As a result, formation of γ-type AlON was confirmed.

Figure 9:
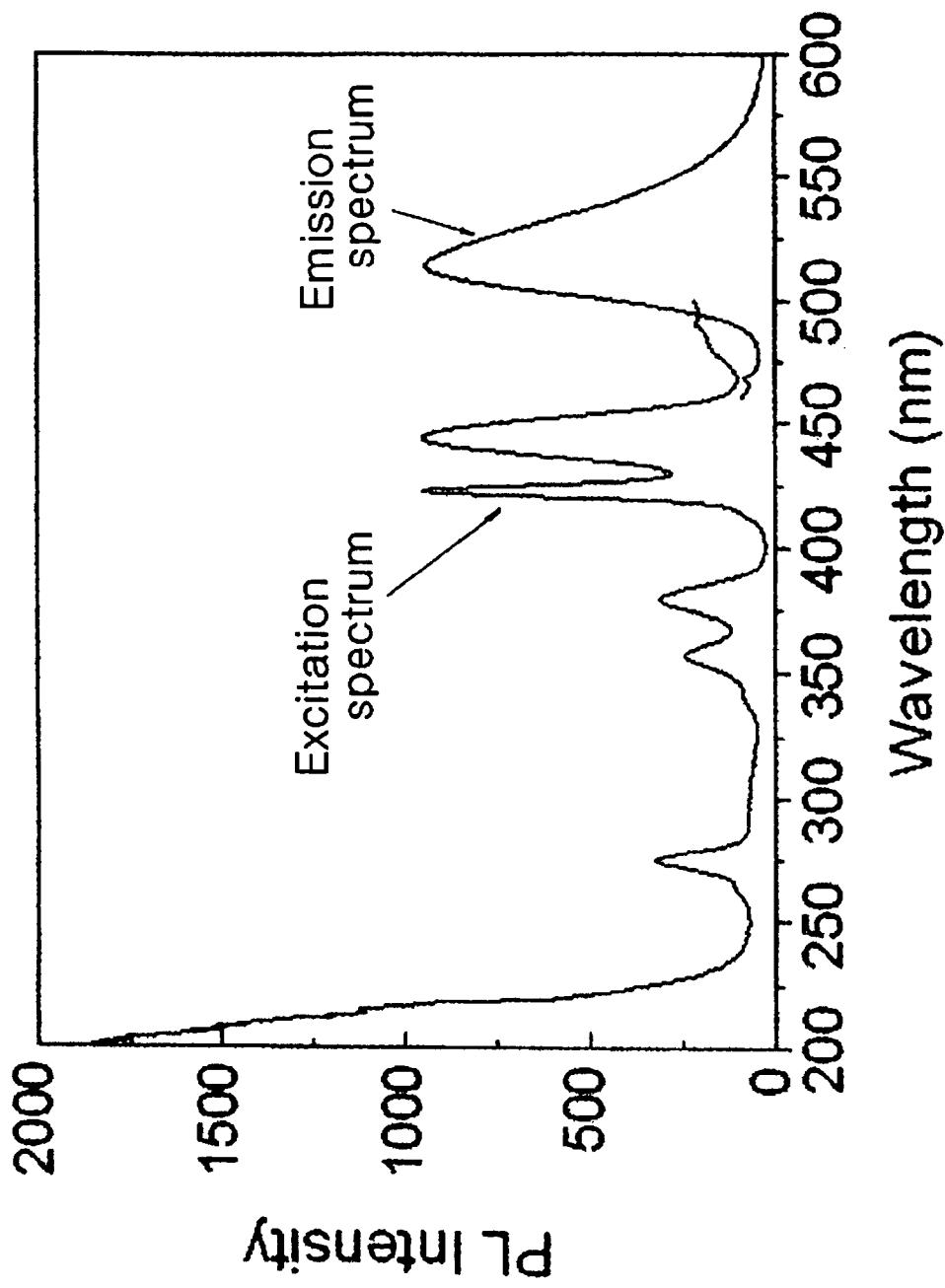
FIG. 9 shows an excitation spectrum and an emission spectrum by fluorescence measurement of Example 44.
Figure 10:
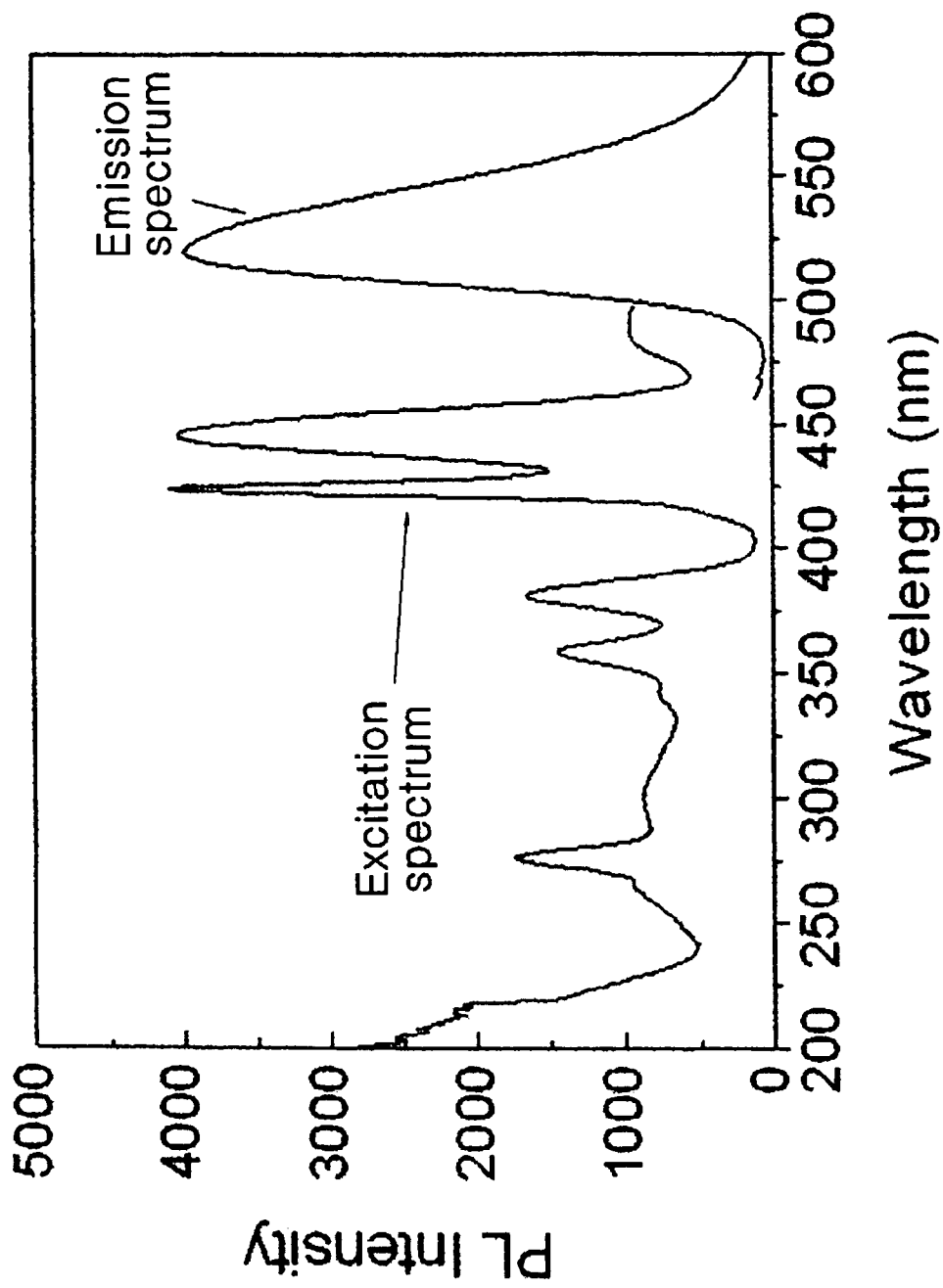
FIG. 10 shows an excitation spectrum and an emission spectrum by fluorescence measurement of Example 45.
Figure 11:
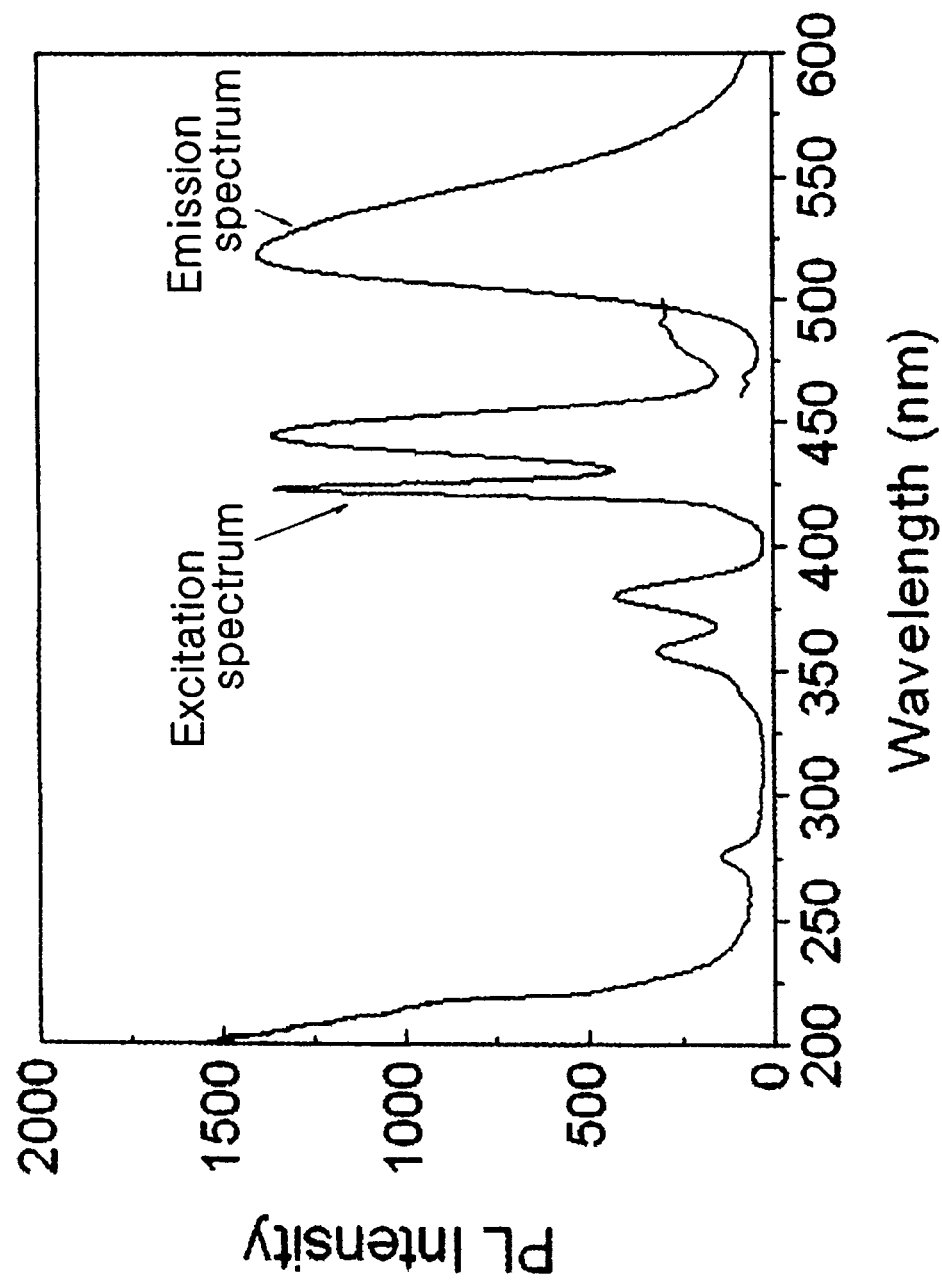
FIG. 11 shows an excitation spectrum and an emission spectrum by fluorescence measurement of Example 46.

As a result of irradiating the thus-obtained powder with a lamp which emitted light of a wavelength of 354 nm, it was confirmed that the powder emits green light. The emission spectrum and excitation spectrum of the powder were measured using a spectrophotofluorometer. FIGS. 9 to 11 show the excitation and emission spectra of Example 44, Example 45, and Example 46, respectively. Here, in the drawings, a peak exceeding the display range of the vertical axis represents direct light or second-order light of excitation light and does not belong to the original spectrum, and may hence be disregarded.

Figure 12:
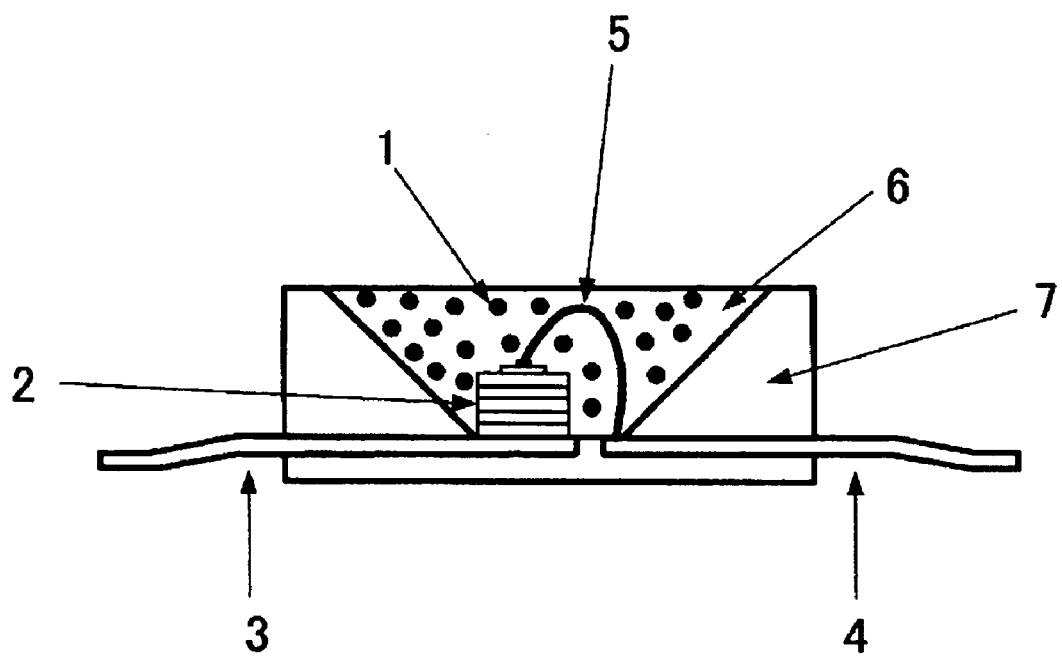
FIG. 12 is a general diagram showing a lighting device (LED lighting device) according to the present invention.

Next, a lighting device utilizing the phosphor of the present invention is explained. FIG. 12 is a schematic structural diagram of a white LED to serve as a lighting device. The LED employs a phosphor mixture 1 containing the phosphor of the present invention and other phosphors, and a 440 nm blue LED chip 2 to serve as a light-emitting device. A coating of the phosphor mixture 1 prepared by dispersing the green phosphor of Example 21 of the present invention, a yellow phosphor of Ca-α-sialon: Eu having a composition formula of $Ca_{0.75}Eu_{0.25}Si_{8.625}Al_{3.375}O_{1.125}N_{14.875}$ and a red phosphor $CaAlSiN_3$: Eu into a resin layer 6 is disposed on the LED chip 2 and arranged in a container 7. When electric currents are passed through conductive terminals 3 and 4, the electric currents are supplied to the LED chip 2 via a wire bond 5. Then, the LED chip 2 emits light of 440 nm, which excites the phosphor mixture 1 comprising the green phosphor, the yellow phosphor, and the red phosphor to emit green, yellow, and red light, respectively. Thus, the device works as a lighting device which emits white light generated by mixing the light emitted by the phosphors and the blue light from the LED chip 2.

Figure 13:
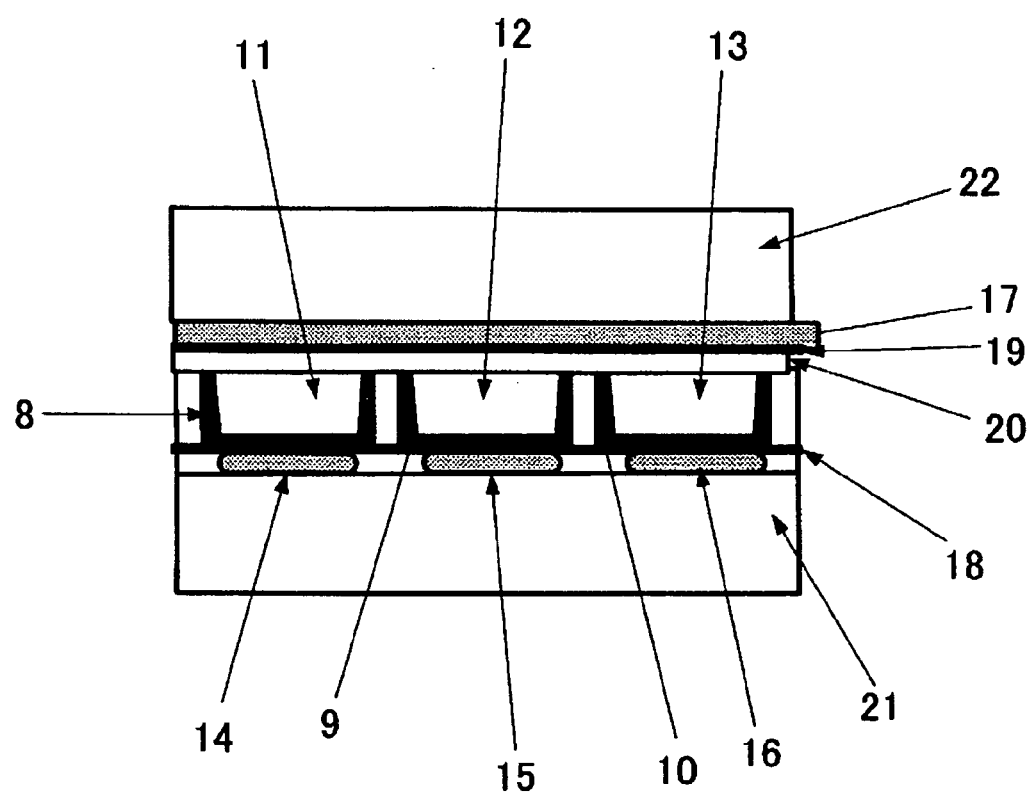
FIG. 13 is a general diagram showing an image display device (Plasma display panel) according to the present invention.

Next, an example of designing an image display device using the phosphor of the present invention is explained. FIG. 13 is a schematic diagram showing the principle of a plasma display panel as an image display device. A red phosphor $(Y(PV)O_4: Eu)$ 8, the green phosphor 9 of Example 21 of the present invention, and a blue phosphor $(BaMgAl_{10}O_{17}: Eu)$ 10 are applied to the internal surface of respective ultraviolet-emitting cells 11, 12, and 13 arranged on a dielectric layer 18 on a glass substrate 21. When electric currents are supplied to electrodes 14, 15, 16, and 17, vacuum ultraviolet radiation is generated by Xe discharge in the cells, and the phosphors are excited by this radiation to emit red, green and blue visible light. The emitted light is observed from the outside via a protection layer 20, a dielectric layer 19, and a glass substrate 22, and functions as an image display.

Figure 14:
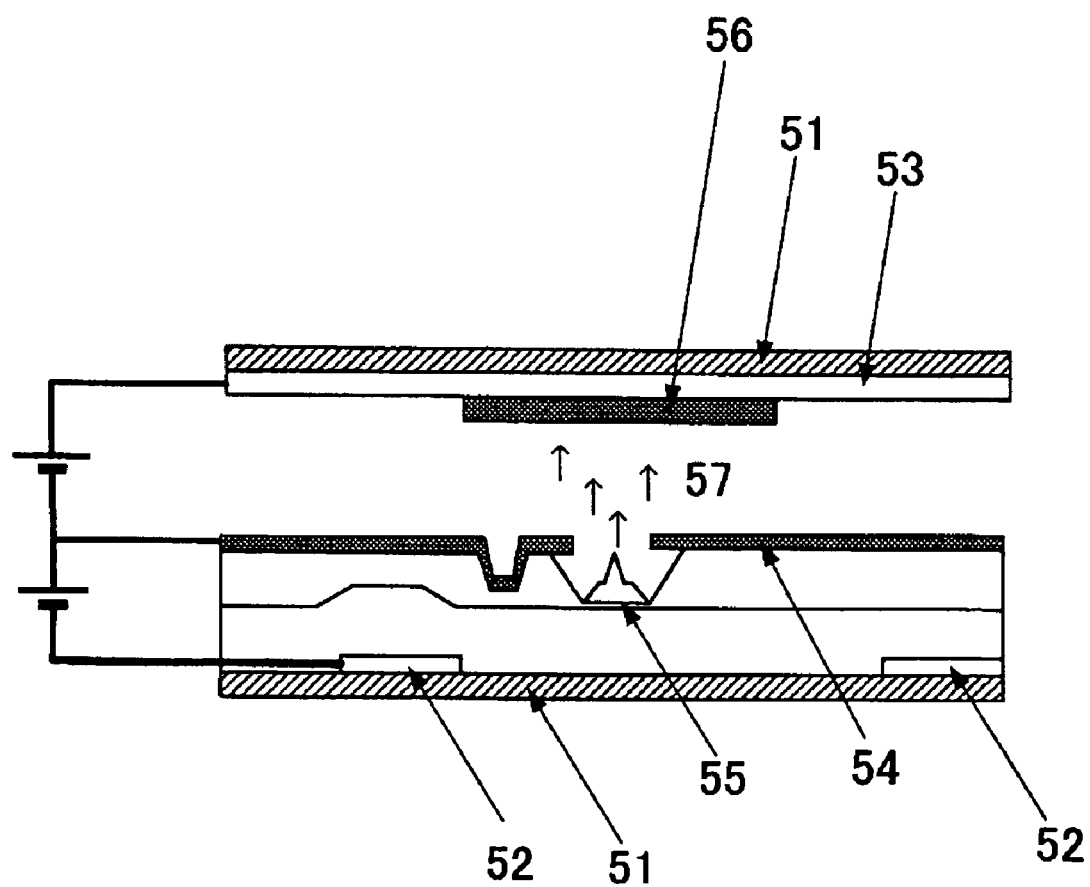
FIG. 14 is a general diagram showing an image display device (Field Emission Display) according to the present invention.

FIG. 14 is a schematic diagram showing the principle of a field emission display panel as an image display device. The green phosphor 56 of Example 21 of the present invention is applied to the internal surface of an anode 53. By applying voltage between a cathode 52 and a gate 54, electrons 57 are emitted from an emitter 55. The electrons 57 are accelerated by the voltage between the anode 53 and cathode 52, and impinge on the phosphor 56 to excite the phosphor to emit light. The entire structure is protected by a glass plate 51. The drawing shows a single light emission cell comprising one emitter and one phosphor. However, an actual display emitting a variety of colors is built by arranging a large number of green and red cells besides blue cells. Although the phosphors used for green and red cells are not particularly specified, phosphors which show high brightness under low-voltage electron beams are preferable.

INDUSTRIAL APPLICABILITY

The phosphor of the present invention exhibits blue emission different from the emission of the conventional sialon phosphor, and shows small deterioration of the brightness when exposed to an excitation source. Hence the nitride phosphor is used suitably for a VFD, an FED, a PDP, a CRT, a white LED, and the like. In the future, it is expected that the phosphor of the present invention will be extensively utilized in various kinds of display devices using electron beam as the excitation source, which will contribute to the development of the industry.

While the foregoing describes the present invention in relation to illustrations and examples, it is understood that it is not intended to limit the scope of the invention to the illustrations and examples described herein. On the contrary, it is intended to cover all alternative modifications and equivalents that may be included in the spirit and the scope of the invention as defined by the appended claims.

What is claimed is:

1. A phosphor comprising: an inorganic crystal having a composition formula: $M_aA_bAl_cO_dN_e$ (where M is at least one selected from among Mn, Ce, Pr, Nd, Sm, Eu, Gd, Tb, Dy, Tm, and Yb, and A is one or two or more kinds of metal elements other than M and Al, and a+b+c+d+e=1) wherein parameters a, b, c, d, and e satisfy the following: satisfy the following:

$$0.00001 \leq a \leq 0.1 \quad (i),$$

$$0 \leq b \leq 0.40 \quad (ii),$$

$$0.10 \leq c \leq 0.48 \quad (iii),$$

$$0.25 \leq d \leq 0.60 \quad (iv), \text{ and}$$

$$0.02 \leq e \leq 0.35 \quad (v);$$

wherein the inorganic crystal is an AlON crystal or an AlON solid solution crystal, or has a same crystal structure as the AlON, wherein at least metal element M constituting a metal ion is incorporated in the inorganic crystal in solid solution, and wherein the phosphor emits fluorescence having a peak in a wavelength range of 300 nm to 700 nm upon irradiation with an excitation source.

2. The phosphor according to claim 1, wherein the element A is at least one selected from among Si, Mg, and Ca.

3. The phosphor according to claim 1, wherein the element A is not contained, that is, a value of b is 0, and wherein parameters c, d, and e satisfy the following:

$$0.25 \leq c \leq 0.48 \quad \text{(vi)}$$

$$0.45 \leq d \leq 0.60 \quad \text{(vii), and}$$

$$0.02 \leq e \leq 0.20 \quad \text{(viii).}$$

4. The phosphor according to claim 1, wherein the inorganic crystal is the AlON crystal or the AlON solid solution crystal, and wherein the metal element M constituting a metal ion is incorporated in the inorganic crystal in solid solution.

5. The phosphor according to claim 1, wherein the excitation source is any one of ultraviolet or visible light having a wavelength that is at least 100 nm and does not exceed 500 nm, an electron beam, and X-rays.

6. The phosphor according to claim 1, wherein at least Eu as the metal element M constituting a metal ion is incorporated in the inorganic crystal in solid solution, and wherein the phosphor emits fluorescence having a peak in a wavelength range of 350 nm to 450 nm upon irradiation with the excitation source.

7. The phosphor according to claim 6, wherein an excitation spectrum has a peak in a wavelength range of 230 nm to 350 nm.

8. The phosphor according to claim 1, wherein at least Ce as the metal element M constituting a metal ion is contained, and wherein the phosphor emits fluorescence having a peak in a wavelength range of 350 nm to 450 nm upon irradiation with the excitation source.

9. The phosphor according to claim 8, wherein an excitation spectrum has a peak in a wavelength range of 230 nm to 350 nm.

10. The phosphor according to claim 1, wherein at least Mn as the metal element M constituting a metal ion is contained and wherein the phosphor emits fluorescence having a peak in a wavelength range of 470 nm to 570 nm upon irradiation with the excitation source.

11. The phosphor according to claim 10, wherein an excitation spectrum has a peak in a wavelength range of 230 nm to 450 nm.

12. The phosphor according to claim 1, wherein at least Ce and Mn as the metal element M constituting metal ions are contained and wherein the phosphor emits fluorescence having a peak in a wavelength range of 470 nm to 570 nm upon irradiation with the excitation source.

13. The phosphor according to claim 12, wherein an excitation spectrum has a peak in a wavelength range of 150 nm to 350 nm.

14. A method for manufacturing the phosphor recited in claim 1, wherein after a raw material mixture including at least aluminum oxide; aluminum nitride; and M metal, M oxide, M carbonate, M nitride, M fluoride, M chloride, M oxynitride, or a combination thereof (where A is one or two or more elements selected from among Mg, Ca, Sr, Ba, Zn, and Cd) is filled into a container at a packing fraction that does not exceed 40% of a bulk density, the raw material mixture is fired in a nitrogen atmosphere that is at least 0.1 MPa and does not exceed 100 MPa in a temperature range that is at least 1500° C. and does not exceed 2200° C.

15. A phosphor comprising: an AlON crystal, an AlON solid solution crystal, or an inorganic crystal having a same crystal structure as the AlON, wherein at least metal element M constituting a metal ion (here, M is at least one selected from among Mn, Ce, Pr, Nd, Sm, Eu, Gd, Tb, Dy, Tm, and Yb) is incorporated in the inorganic crystal in solid solution.

16. A lighting device comprising: an emission source emitting light at a wavelength of 330 to 470 nm; and a phosphor, wherein the phosphor comprises a phosphor recited in claim 15.

17. The lighting device according to claim 16, wherein the emission source comprises: an LED or an LD, and
wherein the phosphor further comprises a yellow phosphor having an emission peak at a wavelength of 550 nm to 600 nm by excitation light of 330 to 420 nm.

18. The lighting device according to claim 17, wherein the emission source comprises: the LED or the LD, and
wherein the phosphor further comprises a red phosphor having an emission peak at a wavelength of 600 nm to 700 nm by excitation light of 330 to 420 nm.

19. The lighting device according to claim 18, wherein the emission source comprises: the LED or the LD, and
wherein the phosphor further comprises a blue phosphor having an emission peak at a wavelength of 450 nm to 500 nm by excitation light of 330 to 420 nm.

20. An image display device comprising: an excitation source and a phosphor, wherein the phosphor comprises: a phosphor recited in claim 15.

21. The image display device according to claim 20, comprising:
any one of a fluorescent display tube (VFD), a field emission display (FED or SED), and a cathode-ray tube (CRT),
wherein the excitation source is an electron beam whose acceleration voltage is from 10 V to 30 kV.

* * * * *